(12) United States Patent
Martini et al.

(10) Patent No.: US 12,366,815 B2
(45) Date of Patent: Jul. 22, 2025

(54) FOCUSING OPTICS FOR USE WITH SEMICONDUCTOR LASERS FOR IMAGING APPLICATIONS

(71) Applicant: Palo Alto Research Center Incorporated, Palo Alto, CA (US)

(72) Inventors: Joerg Martini, San Francisco, CA (US); Zhihong Yang, San Jose, CA (US); Patrick Y. Maeda, Mountain View, CA (US); Yu Wang, Palo Alto, CA (US)

(73) Assignee: Xerox Corporation, Norwalk, CT (US)

( * ) Notice: Subject to any disclaimer, the term of this patent is extended or adjusted under 35 U.S.C. 154(b) by 1004 days.

(21) Appl. No.: 17/408,732

(22) Filed: Aug. 23, 2021

(65) Prior Publication Data
US 2023/0055986 A1 Feb. 23, 2023

(51) Int. Cl.
*G03G 15/043* (2006.01)
*B41J 2/45* (2006.01)
(Continued)

(52) U.S. Cl.
CPC .......... *G03G 15/0435* (2013.01); *B41J 2/451* (2013.01); *B41J 2/455* (2013.01); *G02B 3/0056* (2013.01); *G02B 3/0062* (2013.01); *G02B 3/0087* (2013.01); *G02B 19/0014* (2013.01); *G02B 19/0057* (2013.01); *G03G 15/04072* (2013.01); *H01S 5/18388* (2013.01);
(Continued)

(58) Field of Classification Search
CPC ....... G03G 15/0435; G03G 2215/0404; G03G 15/04072; B41J 2/451; B41J 2/455; H01S 5/18388; H01S 5/423; H01S 5/005; G02B 3/0056; G02B 3/0062; G02B 3/0087; G02B 19/0057; G02B 19/0014
See application file for complete search history.

(56) References Cited

U.S. PATENT DOCUMENTS

| | | |
|---|---|---|
| 4,278,467 A | 7/1981 | Fadner |
| 7,327,774 B2 | 2/2008 | Chabinyc et al. |

(Continued)

FOREIGN PATENT DOCUMENTS

EP 3284790 A2 2/2018

OTHER PUBLICATIONS

Fuyong Yue, Chunmei Zhang, Xiao-Fei Zang, Dandan Wen, Brian D Gerardot, Shuang Zhang and Xianzhong Chen, "High-resolution grayscale image hidden in a laser beam", Light: Science & Applications (2018) 7, 17129; doi:10.1038/lsa.2017.129, Official journal of the CIOMP 2047-7538/18.

(Continued)

*Primary Examiner* — Henok D Legesse
(74) *Attorney, Agent, or Firm* — Ortiz & Lopez, PLLC; Luis M. Ortiz; Kermit D. Lopez

(57) ABSTRACT

Focusing optics can include optical elements disposed and bonded in a linear arrangement (linear array) in at least two rows. A transparent bonding agent can secure alignment of the at least two rows of the optical elements. Scattering elements can also be disposed in the transparent polymer to cause light diffusion. Diffused or un-diffused light from a semiconductor laser array can then be caused to pass through the optical element and illuminate a target substrate such as an imaging member in a printing system.

18 Claims, 31 Drawing Sheets

(51) Int. Cl.
| | |
|---|---|
| B41J 2/455 | (2006.01) |
| G02B 3/00 | (2006.01) |
| G02B 19/00 | (2006.01) |
| G03G 15/04 | (2006.01) |
| H01S 5/183 | (2006.01) |
| H01S 5/42 | (2006.01) |
| H01S 5/00 | (2006.01) |

(52) U.S. Cl.
CPC ..... *H01S 5/423* (2013.01); *G03G 2215/0404* (2013.01); *H01S 5/005* (2013.01)

(56) References Cited

U.S. PATENT DOCUMENTS

| | | | |
|---|---|---|---|
| 7,688,876 | B2 | 3/2010 | Chabinyc et al. |
| 8,264,704 | B2 | 9/2012 | Jackson et al. |
| 9,227,389 | B1 | 1/2016 | Zirilli |
| 9,388,319 | B2 | 7/2016 | Mayo et al. |
| 9,630,424 | B2 | 4/2017 | Stowe et al. |
| 10,965,103 | B2 | 3/2021 | Gronenborn et al. |
| 2005/0019973 | A1 | 1/2005 | Chua |
| 2013/0327237 | A1 | 12/2013 | Jia et al. |
| 2015/0273863 | A1 | 10/2015 | Stowe et al. |
| 2015/0375497 | A1 | 12/2015 | Stowe et al. |
| 2018/0051183 | A1 | 2/2018 | Allen et al. |
| 2019/0270897 | A1 | 9/2019 | Allen et al. |
| 2020/0406544 | A1* | 12/2020 | Rubin Ben Haim ........................ G03G 15/342 |

OTHER PUBLICATIONS

B. Michel et al., "Printing meets lithography: Soft approaches to high-resolution patterning", IBM J. Res. & Dev. vol. 45 No. 5 Sep. 2001.

Sameer S. Deshpande, "Fountain Solution in Lithographic Offset Printing", Jers, vol. II, Issue II, Apr.-Jun. 2011, pp. 82-88.

V. Bardinal, B. Reig, T. Camps, E. Daran, J. B. Doucet, C. Turck, J. P. Malval, D. J. Lougnot, and O. Soppera; "A microtip self-written on a vertical-cavity surface-emitting laser by photopolymerization"; Appl. Phys. Lett. 96, 051114 (2010).

V. Bardinal, B. Reig, T. Camps, C. Levallois, E. Daran, C. Vergnenègre, T. Leïchlé, G. Almuneau, and J. B. Doucet; "Spotted Custom Lenses to Tailor the Divergence of Vertical-Cavity Surface-Emitting Lasers"; IEEE Photonics Technology Letters, vol. 22, No. 21, Nov. 1, 2010.

V. Bardinal, T. Camps, B. Reig, D. Barat, E. Daran, and J. B. Doucet; "Collective Micro-Optics Technologies for VCSEL Photonic Integration", Hindawi Publishing Corporation, Advances in Optical Technologies, vol. 2011, Article ID 609643, 11 pages, doi:10.1155/2011/609643.

O. Blum, et al., "Vertical-cavity surface-emitting lasers with integrated refractive microlenses", Electronics Letters, Jan. 5, 1995, vol. 31, No. 1.

Yongqi Fu, "Integration of Microdiffractive Lens with Continuous Relief with Vertical-Cavity Surface-Emitting Lasers Using Focused Ion Beam Direct Milling", IEEE Photonics Technology Letters, vol. 13, No. 5, May 2001.

Si-Hyun Park, Yeonsang Park, Hyejin Kim, Heonsu Jeon, Seong Mo Hwang, Jeong Kwan Lee, Seung Ho Nam, Byeong Cheon Koh, J. Y. Sohn, and D. S. Kim; "Microlensed vertical-cavity surface-emitting laser for stable single fundamental mode operation", Appl. Phys. Lett. 80, 183 (2002).

Zhenfu Wang, et al., "High power and good beam quality of two-dimensional VCSEL array with integrated GaAs microlens array", Nov. 8, 2010 / vol. 18, No. 23 / Optics Express 23900.

* cited by examiner

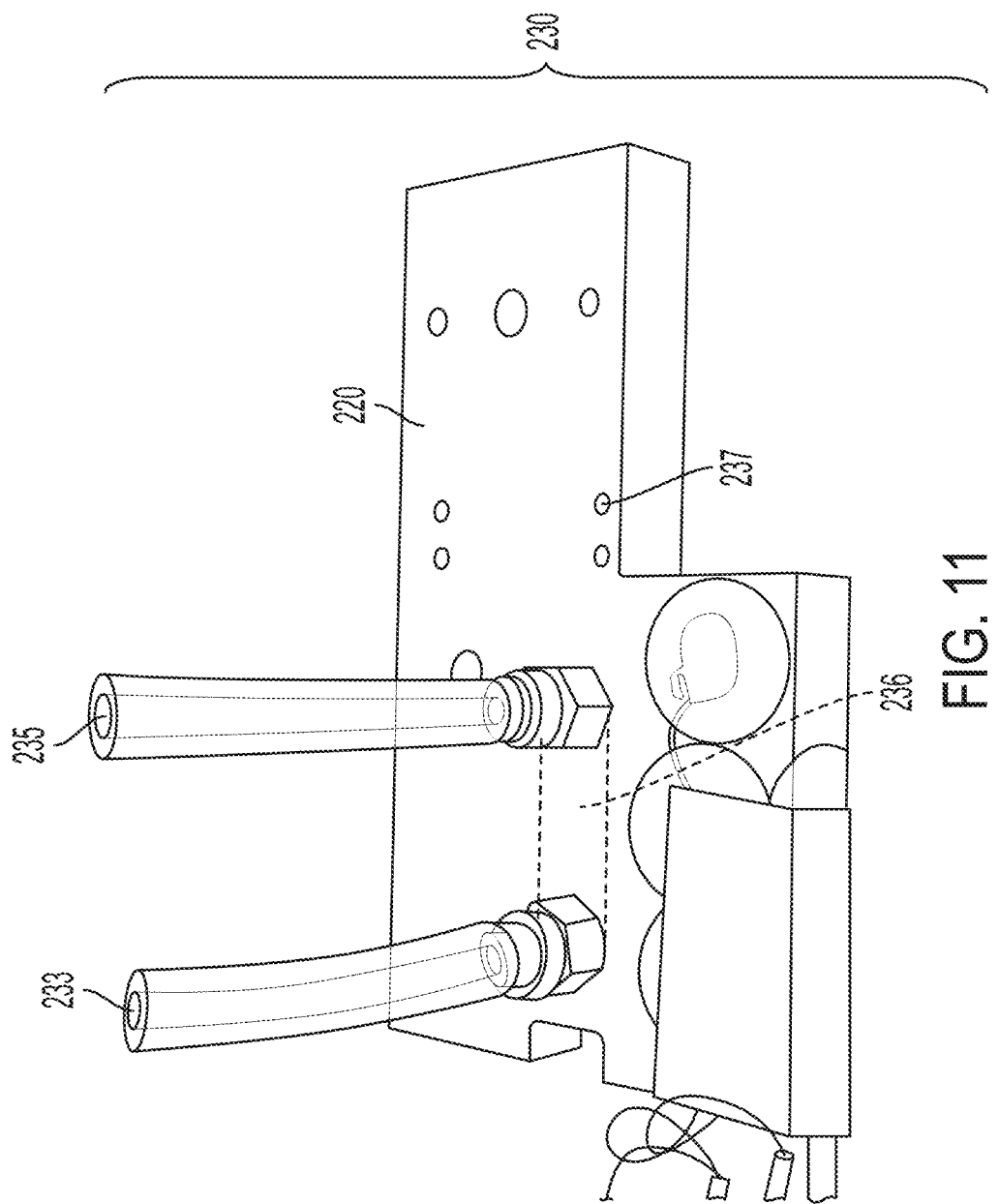

FOCUSING OPTICS FOR USE WITH SEMICONDUCTOR LASERS FOR IMAGING APPLICATIONS

TECHNICAL FIELD

Embodiments are related to focusing optics used with semiconductor lasers. More particularly, embodiments relate to systems and methods providing the use of an array of optical elements configured to focus light emitted from pixels formed at an array of semiconductor lasers on to a target such as an imaging member in a printing system. Additionally, the array of semiconductor lasers can be independently-addressable vertical cavity surface surface-emitting laser (VCSEL) architectures that can produce high power and accommodate tight-pitch packing in imaging applications and the lens array can be assembled in at least two rows of gradient-index (GRIN) lenses coupled together.

BACKGROUND

VCSELs are semiconductor-based lasers that emit light perpendicular to a substrate. If properly designed, technical uses of VCSEL arrays can include data communication systems, light detection and ranging (lidar) systems, printing systems, laser processing systems, zone heating or curing, illumination systems, 3d mapping systems, and facial recognition devices (e.g., smartphone face identification).

High power surface-emitting lasers typically require large apertures because the light-emitting area of the device needs to be big enough to support the requisite high light output. For example, the typical aperture of vertical-cavity surface-emitting lasers capable of producing 50 mW of light output needs to be about 18 µm in diameter or larger. The overall device size would be larger still because the device structure typically includes oxidation channels and electrical contacts that extend beyond just the aperture.

One of the primary advantages of VCSELs is that if properly arranged they could be patterned into dense arrays with many hundreds or thousands of individual emitters operating as pixels. This would be important because some applications require high power surface-emitting lasers to be packed into tight-pitch arrays, where the linear pitch is comparable to or smaller than the normal dimensions of the device. For example, in 1200 dpi printing applications, where each laser pixel in the array would be used to address one dot on an image, the required linear spacing between laser address lines would be about 21.2 µm. This linear pitch is tighter than the size of current semiconductor laser devices capable of producing 50 mW of light output. Efficient or high intensity semiconductor lasers today often operate in wavelength regions between 550 nm to 1000 nm. The very close spacing between lasers in such arrays can make thermal crosstalk problematic, as heat from each laser can affect the performance of nearby lasers. Also, the aggregate electrical power drop from a large number of high power lasers operating within a small region can lead to a high thermal load density that must be dissipated.

What is needed are independently-addressable VCSEL architectures that can produce high power at a resolution greater than 300 dpi and which can accommodate tight-pitch packing while overcoming thermally induced shortcomings.

SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

In accordance with the embodiments, a semiconductor laser (e.g., VCSEL) architecture is disclosed that can achieve 300 to at least 1200 DPI digital addressability. The architecture can have features that include improved laser array designs, improved laser array geometries, and chip tiling. In printing applications, for example, VCSELs operating as pixels and deployed in an array format according to the embodiments can deliver up to and exceeding 50 milliwatts of laser power with aperture sizes that can enable high resolution (e.g., >300 dpi) resolution.

In accordance with the embodiments, a semiconductor laser array can be used as an individually addressable light source in, for example, the DALI (digital architecture for Lithographic Inks) printing process utilizing a dramatically reduced size and complexity for the most sophisticated component in the printing system—the laser imager.

In accordance with the embodiments, large area, high power VCSEL arrays as presented herein also can be useful for various applications such as facial recognition, laser sintering, contact-free thermochromic printing, zone heating and curing, and lidar applications.

In accordance with the embodiments, a focusing optical lens array can be provided that includes optical elements disposed in a linear arrangement in at least two rows and bonded in the linear arrangement. Bonding can be by use of a transparent polymer.

In accordance with the embodiments, the transparent polymer can function as a bonding agent too secure alignment of the rows of the optical elements while reducing light absorption.

In accordance with the embodiments, scattering elements can also be disposed in the transparent polymer to cause light diffusion.

In accordance with the embodiments, diffused or un-diffused light from a semiconductor laser array can then be caused to pass through the optical element and illuminate a target substrate.

In accordance with another feature of the embodiments, a semiconductor laser array can use two two-row GRIN lens arrays with cladding removed from one side of each of the two-row GRIN lens arrays, and the two two-row GRIN lens arrays can be adhered together at one side of each of the two-row GRIN lens arrays where cladding was removed, thereby forming a four-row GRIN lens array.

BRIEF DECRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the embodiments.

FIG. 11 illustrates a photograph of the backside view of a submount showing how cooling fluid tubes can be attached to the submount and also showing how integrated mounting holes can be formed therein for attaching optical elements, in accordance with the embodiments;

Figure 20:
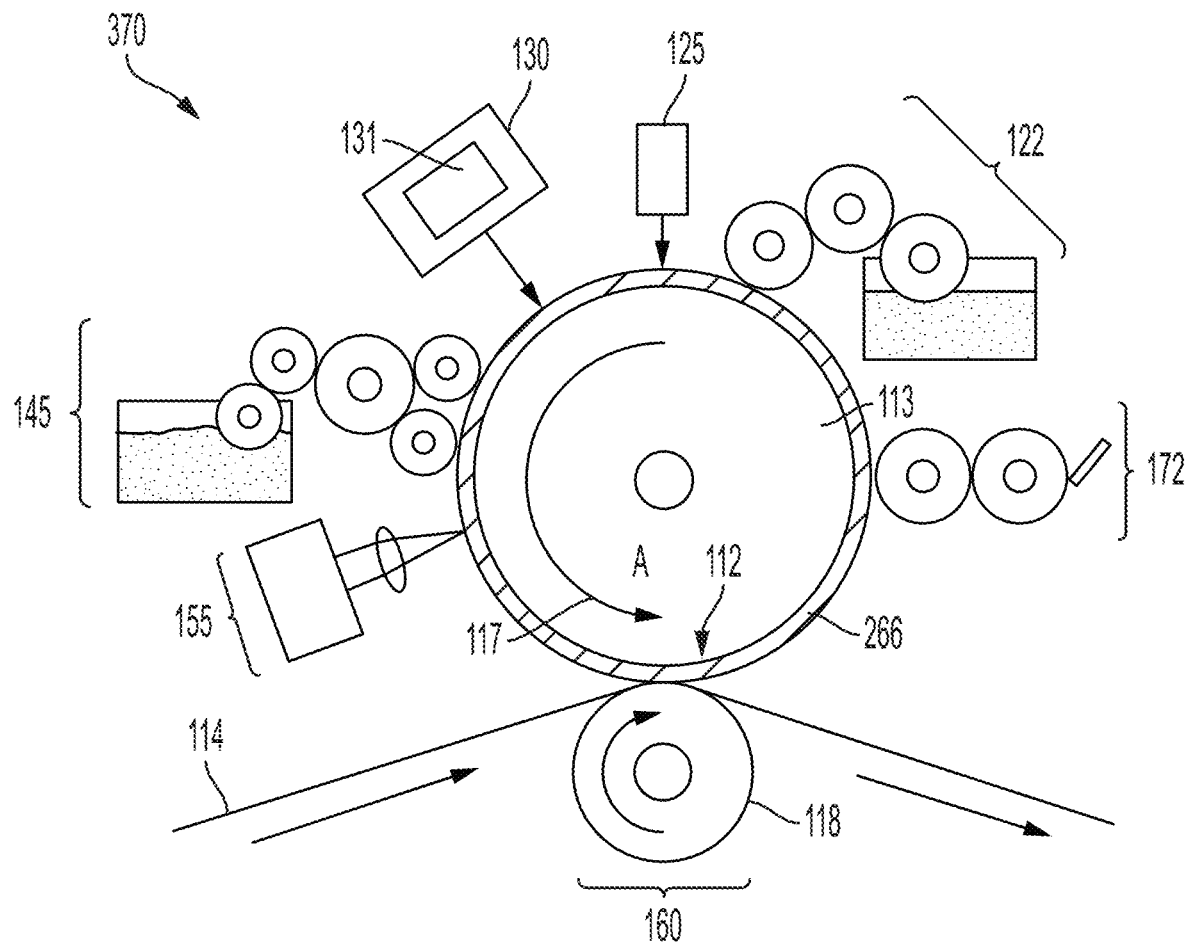
Figure 21A:
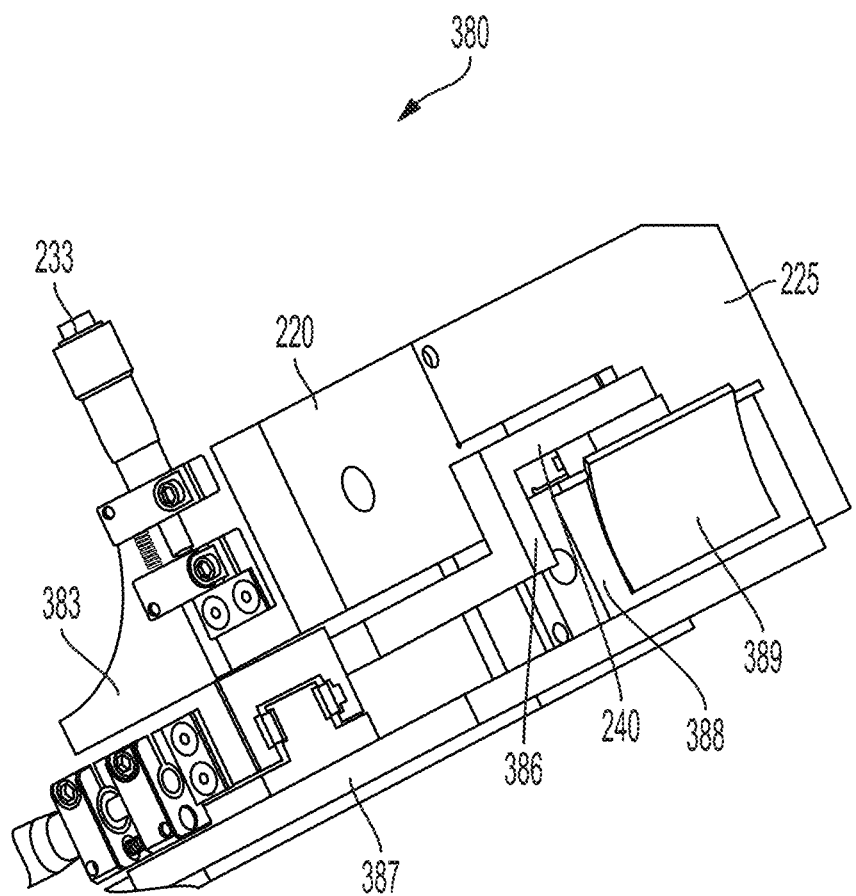
Figure 21B:
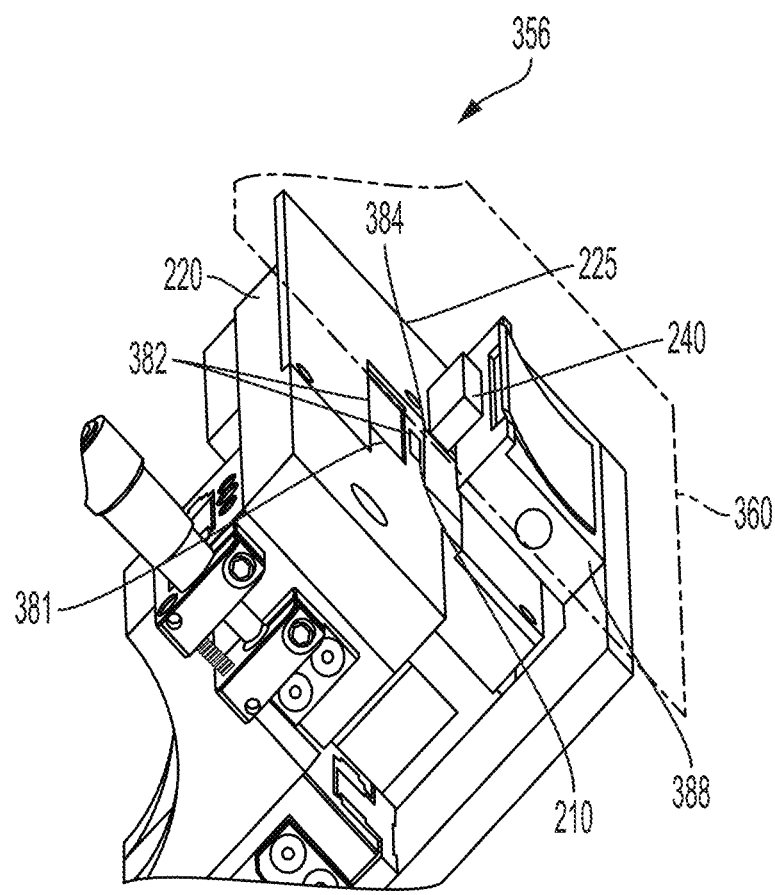
Figure 22:
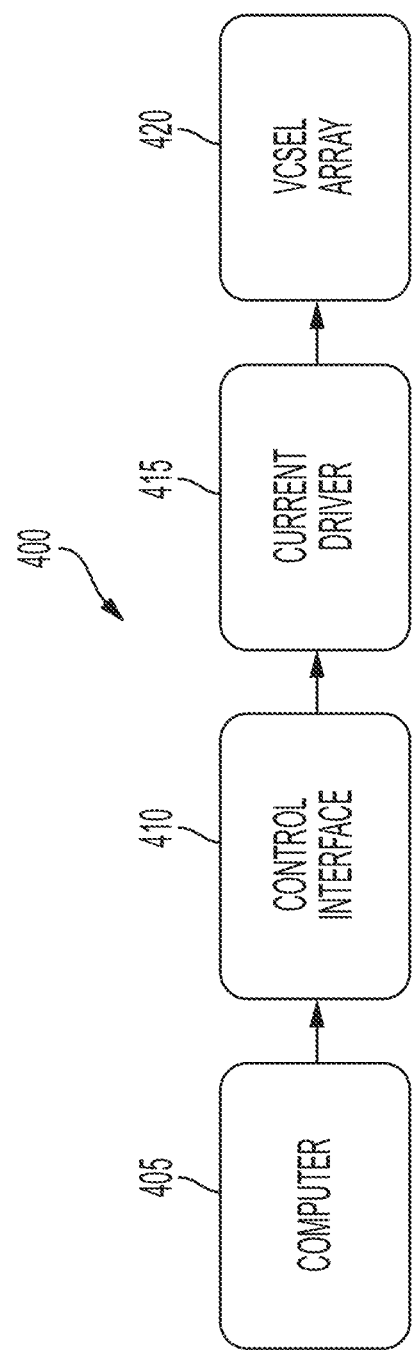
Figure 23A:
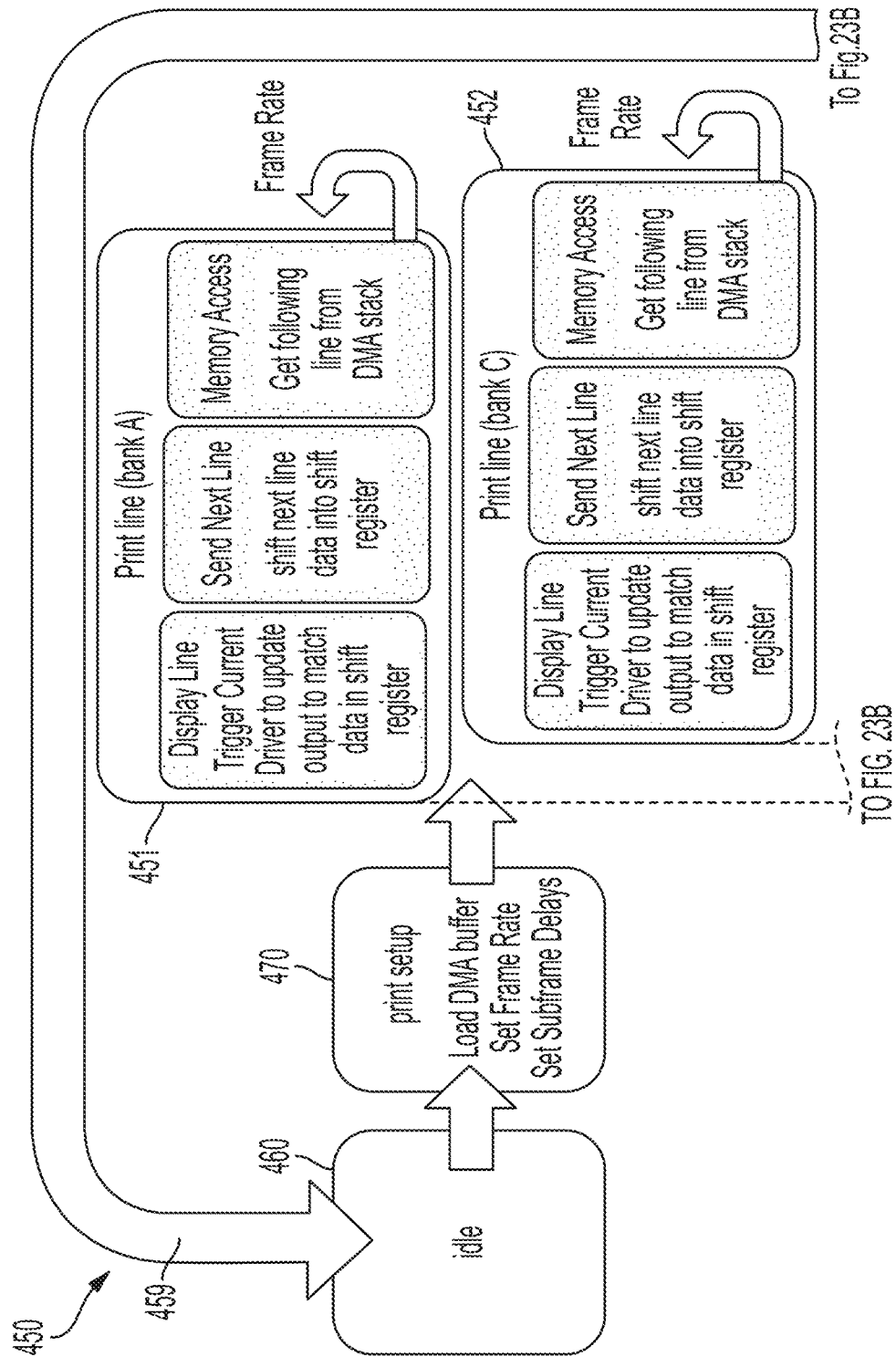
Figure 23B:
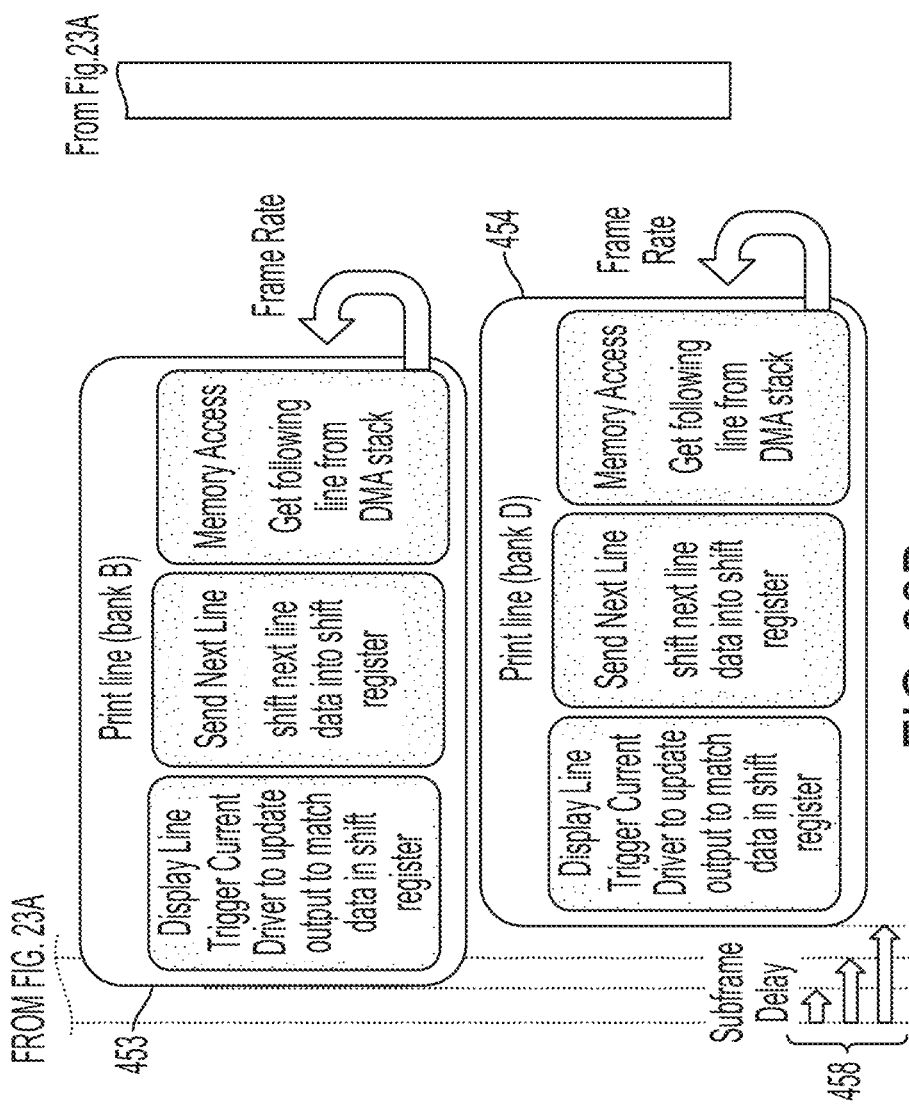
Figure 24:
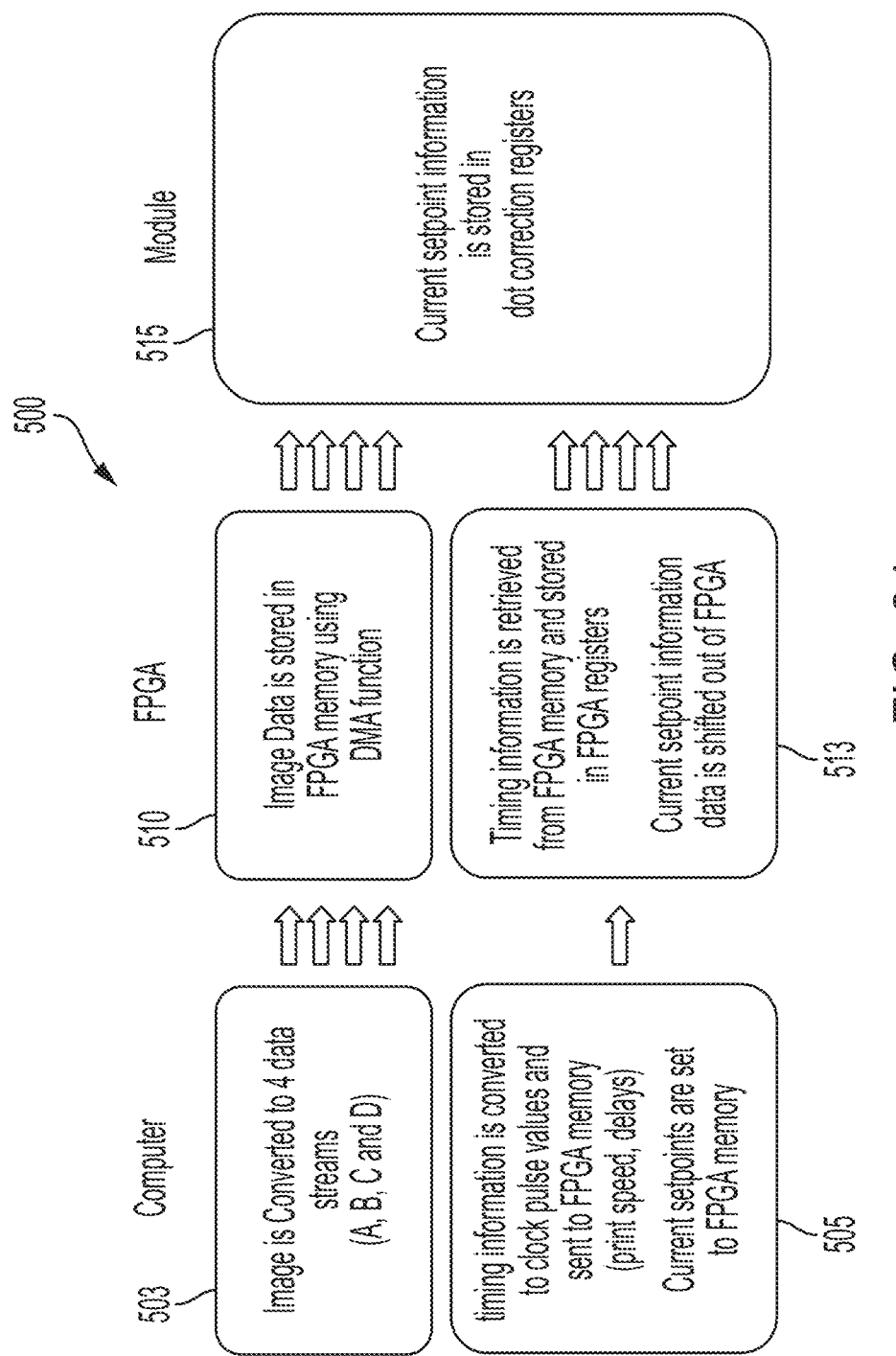
Figure 25:
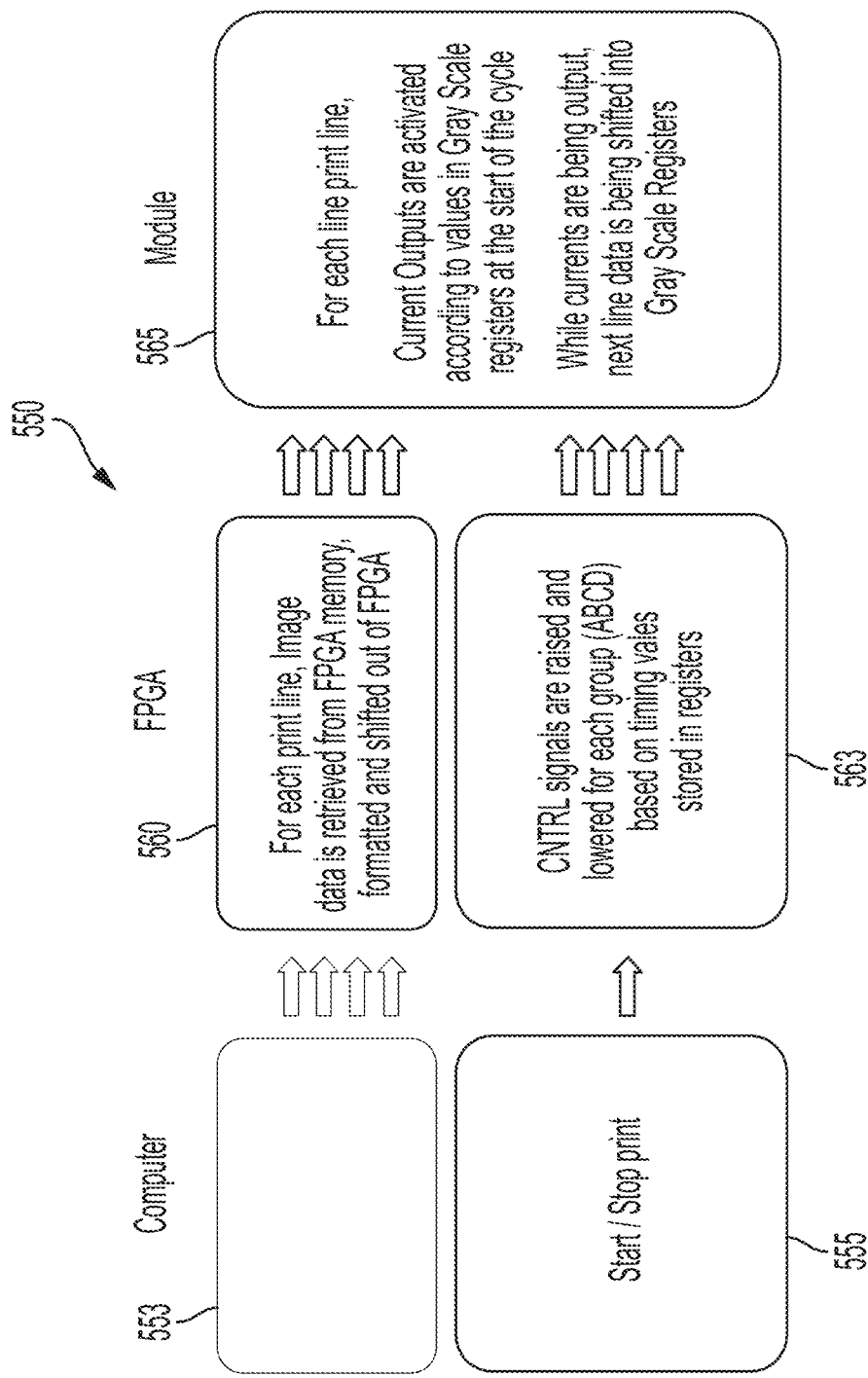

FIG. 20, labeled as Prior Art, illustrates a diagram of components of a printing system incorporating a laser array for inducing fountain solution evaporation via laser patterning and associated printing steps, in accordance with the embodiments;

FIG. 21A illustrates a diagram of components of a completed VCSEL array-based imaging member, in accordance with the embodiments;

FIG. 21B illustrates a diagram of a side perspective of the completed VCSEL array-based imaging member presented in FIG. 21A;

FIG. 22 illustrates a block diagram of electronic modules operating as part of a printing system, in accordance with the embodiments;

FIG. 23A to FIG. 23B illustrate block diagrams of programming states during printing when using a VCSELs for document processing, in accordance with the embodiments;

FIG. 24 illustrates a block diagram representing functions that can occur in primary modules of a printing system where VCSEL array usage is incorporated, in accordance with the embodiments; and FIG. 25 illustrates another block diagram representing functions that can occur in primary modules of a printing system where VCSEL array usage is incorporated, in accordance with the embodiments.

DETAILED DECRIPTION

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein do not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

Although embodiments are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of stations" may include two or more stations. The terms "first," "second," and the like, herein do not denote any order, quantity, or importance, but rather can be used to distinguish one element from another. The terms "a" and "an" herein may not denote a limitation of quantity, but rather can denote the presence of at least one of the referenced item.

The term "printing device", "printing system", or "digital printing system" as used herein can refer to a digital copier or printer, scanner, image printing machine, digital production press, document processing system, image reproduction machine, bookmaking machine, facsimile machine, multi-function machine, or the like and can include several marking engines, feed mechanism, scanning assembly as well as other print media processing units, such as paper feeders, finishers, and the like. The digital printing system can handle sheets, webs, marking materials, and the like. A digital printing system can place marks on any surface, and the like and is any machine that can read marks on input sheets, or any combination of such machines.

The term "pitch" as used herein can refer to the minimum center-to-center distance between interconnect lines. As a half pitch can approximate the minimum linewidth, it can be used as an indicator of an IC's integration level.

The term "semiconductor laser" as used herein can refer to surface emitting semiconductor lasers such as VCSELs (vertical cavity surface emitting lasers) or the like which can be fabricated on semiconductor substrate using semiconductor manufacturing techniques.

When properly designed, current state-of-the-art VCSELs (vertical-cavity-surface-emitting lasers) have the capability of producing enough light output power to be deployed in an array format that, if configured and packaged appropriately, could be used in high resolution evaporation of fountain solutions in high speed printing systems. Such systems require each VCSEL in the array to produce tens of milliwatts of light output power as standalone devices when operated alone and for the VCSEL array and its packaging to be designed so lasers retain that capability even when adjacent devices are simultaneously turned on. Features of embodiments provide, among other things, unique VCSEL array chip designs, that can result in high power small pitch individually addressable lasers, ways to mount, cool, drive, and image large numbers of VCSEL array chips so that wide width (>100 mm) printing can be enabled with the chips, and an example of VCSEL arrays used for printing in the DALI (digital architecture for Lithographic Inks) printing process.

To enable tight-pitch packing of independently-addressable high power surface-emitting lasers on VCSEL array chips described herein. In some embodiments the VCSEL share a cathode and they are individually addressable through individual address lines connecting individual VCSEL anodes. In some embodiments a common anode addressing architecture can be employed where each address line within the array can encompass multiple electrically-connected apertures. Non-symmetric aperture shapes can also be employed that are elongated to fit within the pitch of the address lines. Additionally, the spacing of lasers in the process direction can be tolerated by, for example, the Dali print process to increase the total distance of lasers while still maintaining an effective cross-process spacing that can be smaller than the size of lasers themselves.

Figure 8:
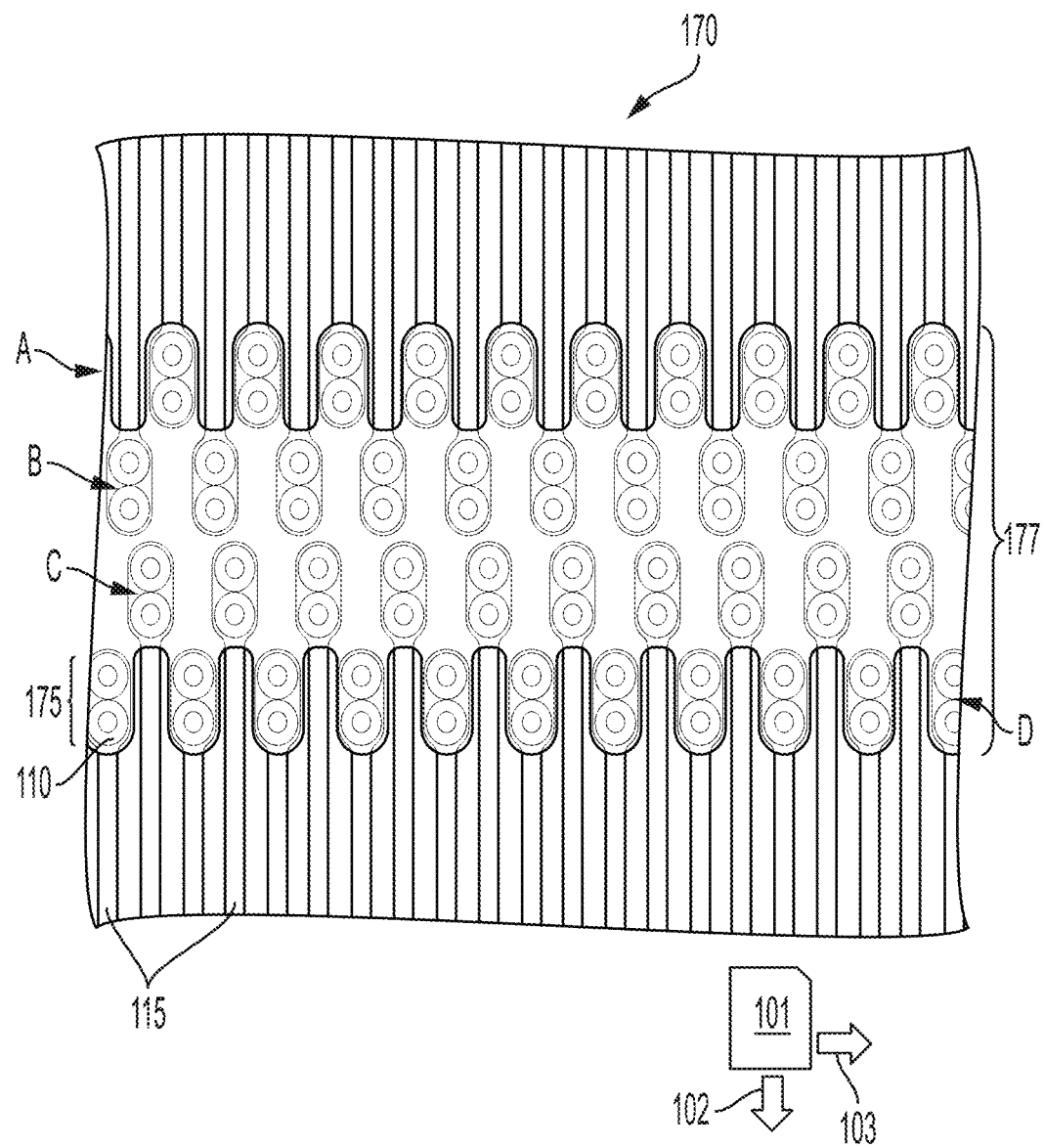
FIG. 8 illustrates an optical micrograph for a portion of a 1200 dpi laser array utilizing a common anode multi-aperture pixel design, in accordance with the embodiments.

"Pixel" can refer to a set of multiple VCSELs or 1 VCSEL. For example, in FIG. 6, 1 pixel comprises 1 laser. In FIG. 8, 1 pixel comprises 2 lasers that are tied together. In FIG. 10, 1 pixel comprises a set of 3 VCSELs.

The "aggregate linear pitch" as mentioned herein refers the cross process spacing between adjacent cross process direction lasers regardless of their position in the process direction. For example, in FIG. 8, it is the cross process spacing between set B and set C, which is 21.2 um. The "size of the laser" in FIG. 8 is the "width" of the common anode metal contact for laser set B.

Optimized thermal management of VCSEL array chips can be achieved, with two unique approaches (that can be used together): a) Direct die attach to mechanical blocks that incorporate means of cooling for example by cooling fluid channels or heat pipes, slots for driver chips, and mounting systems for optics and b) Ultra-thin laser epi transferred to thermally-conductive metal host substrates.

Allow stitching of VCSEL array chips is enabled so that the effective (stitched) laser array width meets the demand for today's production print width. The effective laser array contains means to focus the laser light originating from the VCSELs, drive individual lasers, cool lasers, and extract evaporated fountain solution during DALI printing operations.

VCSEL Array Chip Designs

Figure 1:
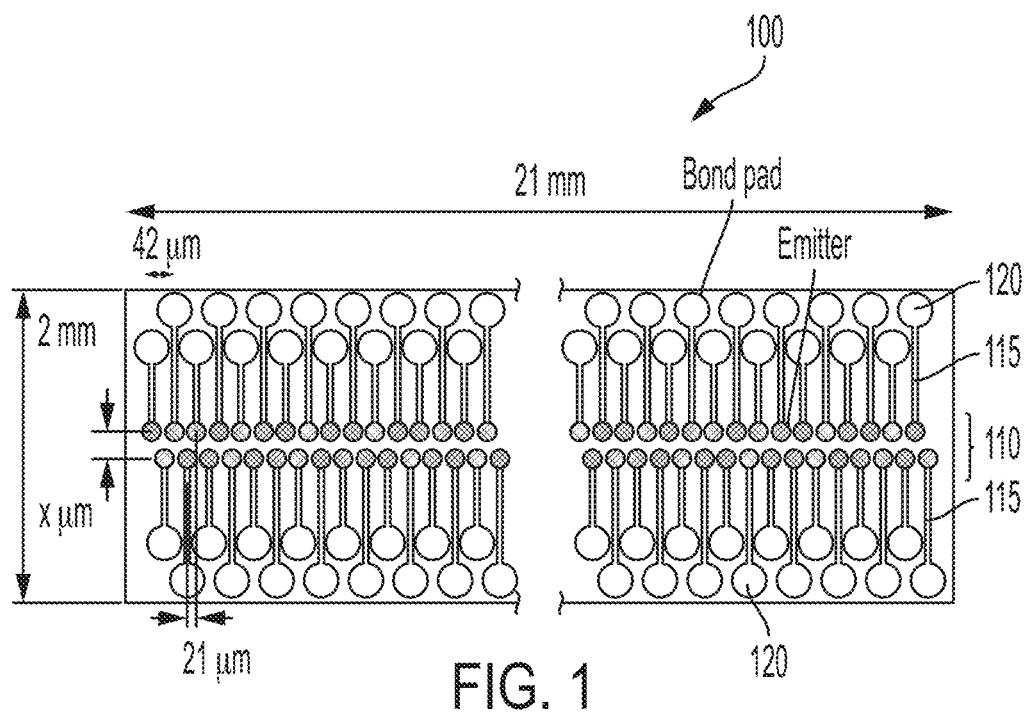
FIG. 1 illustrates an architecture for an independently-addressable high power laser array on 1200 dpi pitch, in accordance with the embodiments.
Figure 2:
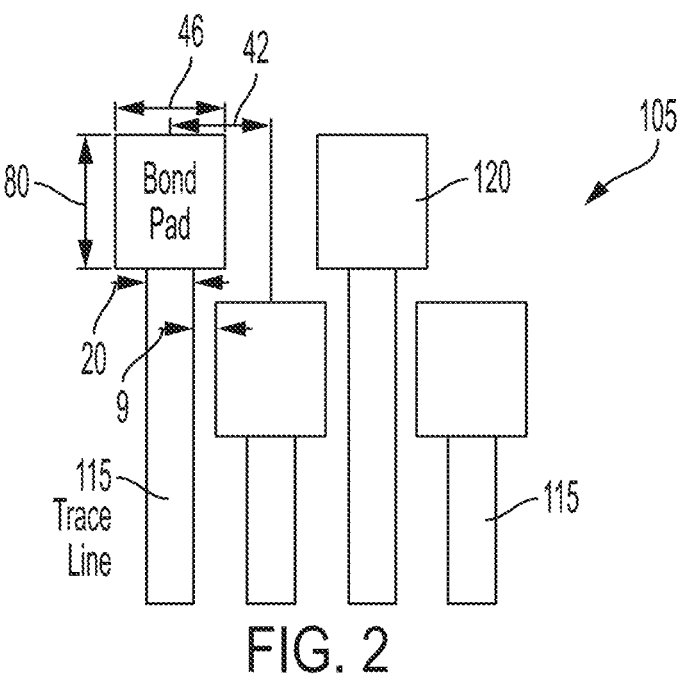
FIG. 2 illustrates an example block diagram of layout and dimensions that can satisfy achievement of high resolution lasing and imaging objectives by staggering the arrangement of bond pads and trace lines, in accordance with the embodiments.

Referring to FIG. 1, illustrated is an architecture for an independently-addressable high power laser array on 1200 dpi pitch, in accordance with features of the embodiments. FIG. 1 illustrates an arrangement of a linear array 100 of VCSELs 110 with address trace lines115 having a 21.2 μm pitch. The electrical contact pads 120 must be large enough to allow wire bonding, and the electrical trace lines 115 must be wide enough to allow for low sheet resistance and negligible voltage drops when electrified with a signal during operation. In the embodiment shown, the semiconductor lasers 110 are arranged along two rows with one set of address lines 115 coming in from the top and another set from the bottom. The two rows of lasers are offset relative to each other to form an interdigitated linear array of light emitters on 21.2 μm pitch. The contact pads 120 on each side can also have a staggered arrangement so they can be large enough for wire bonding and still fit within the available space between address lines. FIG. 1 shows a 21 mm long×2 mm wide chip which can contain 1000 lasers. Referring to FIG. 2, illustrated further is an example layout 105 and dimensions for bond pads 120 and trace lines 115 that can further satisfy achievement of objectives illustrated in FIG. 1.

Figure 3:
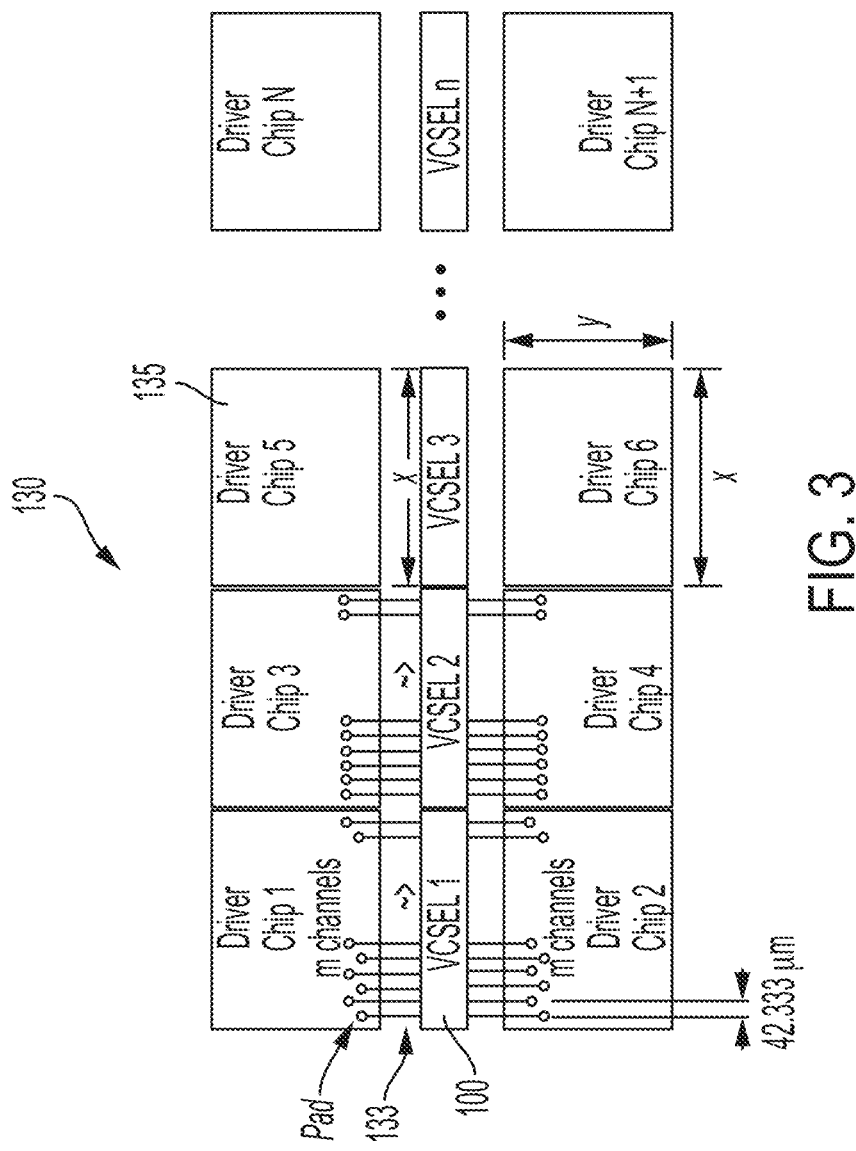
FIG. 3 illustrates an example block diagram of wire bonding connections for individual lasers to their associated driver chips, in accordance with the embodiments.

Referring to FIG. 3, illustrated is an example block diagram 130 of wire bonding connections 133 for individual VCSELs 110 of each VCSEL array chip 100 to dedicated channels of their associated driver chips 135, in accordance with the embodiments. The wire bonding connections 133 to their respective driver ships 135 can have the identical pitch as the laser pitch, or slightly varying pitch, for example smaller pitch. FIG. 3 illustrates how the individual laser chips 100 can be connected to their respective driver chips 135 via the wire bonding connections 133.

Figure 4:
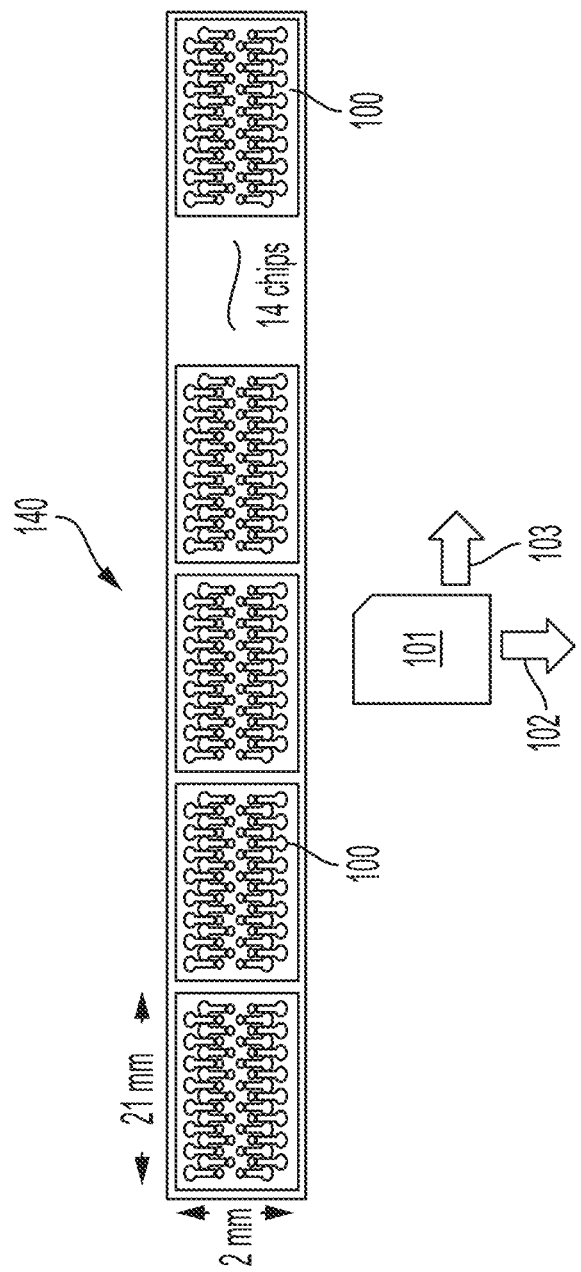
FIG. 4 illustrates a block diagram of an 11 inch-wide VCSEL imager for a 1200 dpi printing system that can be comprised of multiple tiled laser arrays chips, in accordance with the embodiments.
Figure 5:
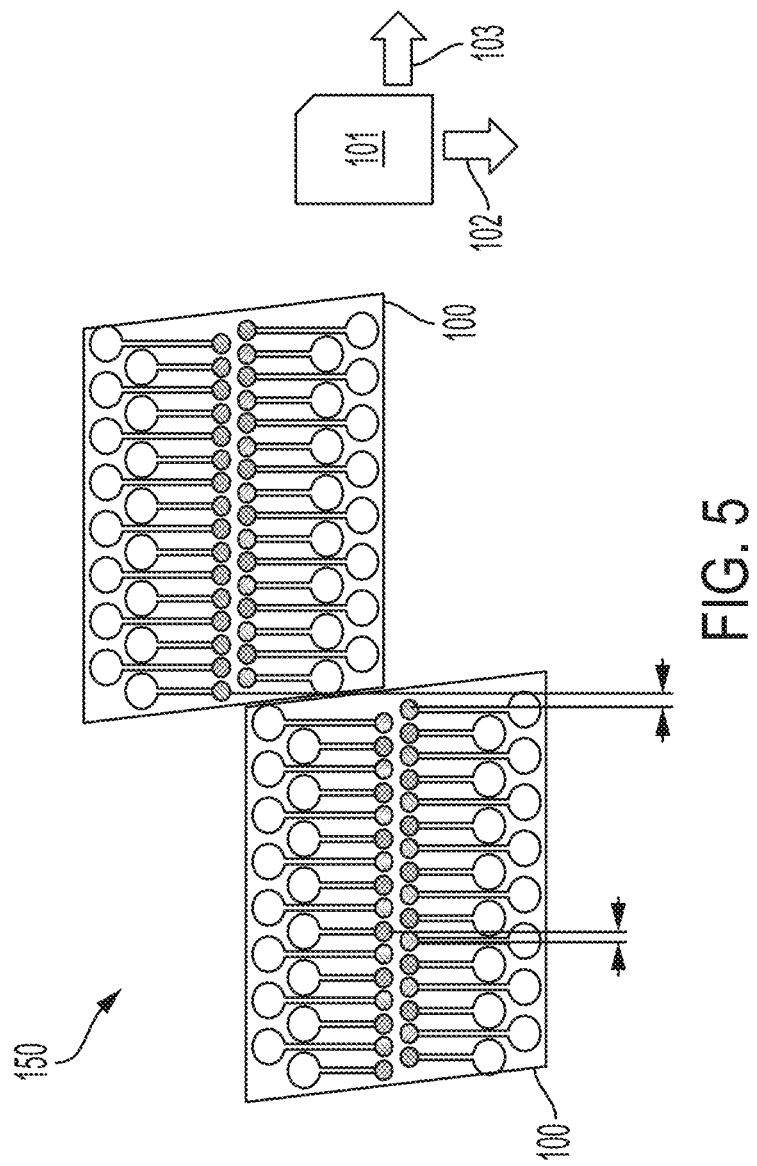
FIG. 5 illustrates a block diagram of laser array chips placed in a staggered arrangement, in accordance with the embodiments.

In an example implementation for printing, many laser array chips 100 would be arranged side by side along a cross-process (or x) direction for a document 101, as indicated by arrow 103 to form a wide imager 140. FIG. 4 illustrates a 14-chip arrangement forming an 11 inch-wide 1200 dpi imager 140 to process images for documents 101 flowing in the process (or y) direction as indicated by arrow 102. The tiled laser array chips 100 can also have a staggered arrangement 150 as illustrated in FIG. 5 to process images for documents 101 flowing in the process direction 102 as shown, instead of a straight side-by-side arrangement as shown in FIG. 4. In a staggered placement design, the portions of the print frame corresponding to the individual chips receive appropriate timing delays, so the final image formed is stitched correctly. Imperfections in alignment can also be accommodated by performing calibrations to adjust the relative timing delays for each laser chip 100. In other embodiments, laser array chips can have dedicated alignment structures to ensure correct alignment of two neighboring laser array chips or correct alignment relative to the support structure.

In order to accommodate a large aperture size capable of delivering light outputs of up to 50 mW per laser, an asymmetric laser aperture design can be utilized, instead of a usual circular aperture. The shape of the aperture can be "squeezed" along the direction of the array, so it fits within the available space of the tight pitch arrangement. The aperture can be commensurately "elongated" in the direction of the address line to compensate for the squeezed dimension, so a sufficiently large light-emitting area still can be attained.

Figure 6:
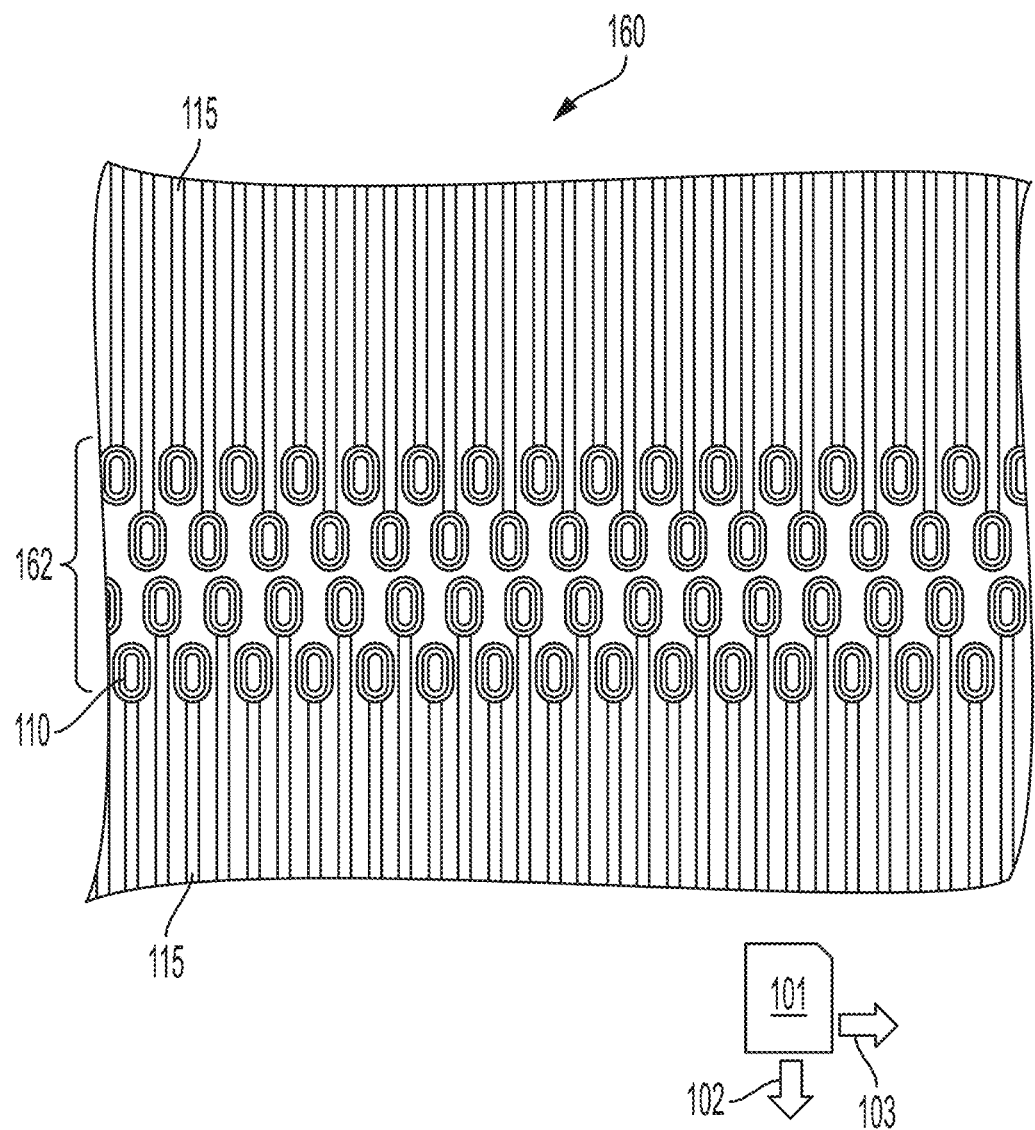
FIG. 6 illustrates an optical micrograph for a portion of a 1200 dpi laser array utilizing an asymmetric laser aperture design, in accordance with the embodiments.
Figure 7:
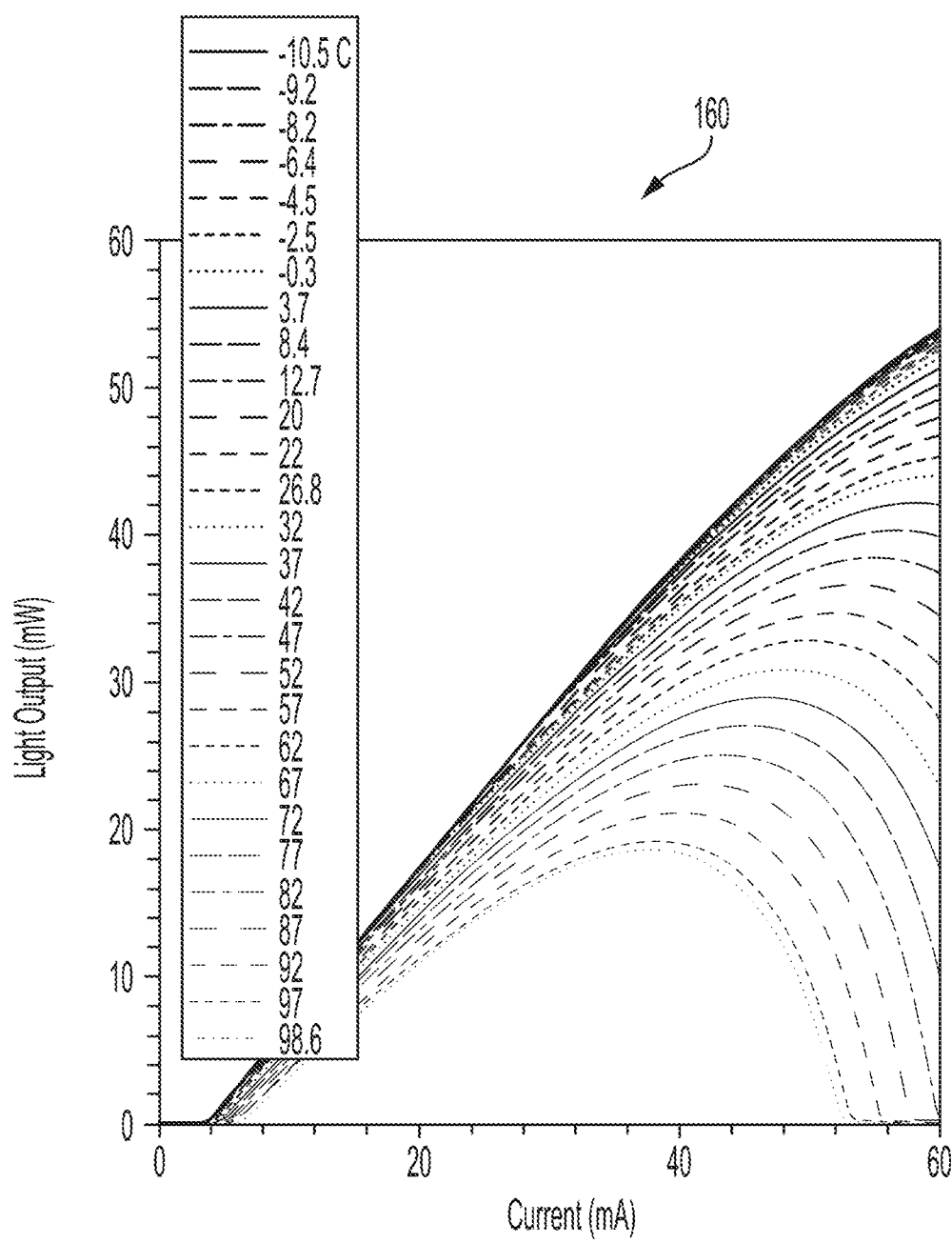
FIG. 7 illustrates a chart of Light Output vs. Current Curves for a device at different substrate temperatures showing peak output powers of over 50 mW, in accordance with the embodiments.

FIG. 6 illustrates an optical micrograph for a portion of a 1200 dpi laser array 160 utilizing an oblong 8×32 µm aperture shape for its VCSEL light emitters 110. The process direction 102 is shown by document icon 101. The light emitters 110 can be arranged in 4 interdigitated rows 162 with half of the addressing trace lines coming from the top side and half from the bottom side. The emitter aperture could be placed in a different angle so that the width in cross process direction is effectively the same as the emitter pitch (e.g., 21.2 µm). For the 8×32 µm aperture shape a 50.5 deg angle would accomplish that for example. FIG. 7 illustrates a graph of measured Light Output vs. Current curves at different substrate temperatures for each VCSEL device, indicating a peak per-device light output power of over 50 mW.

Figure 9:
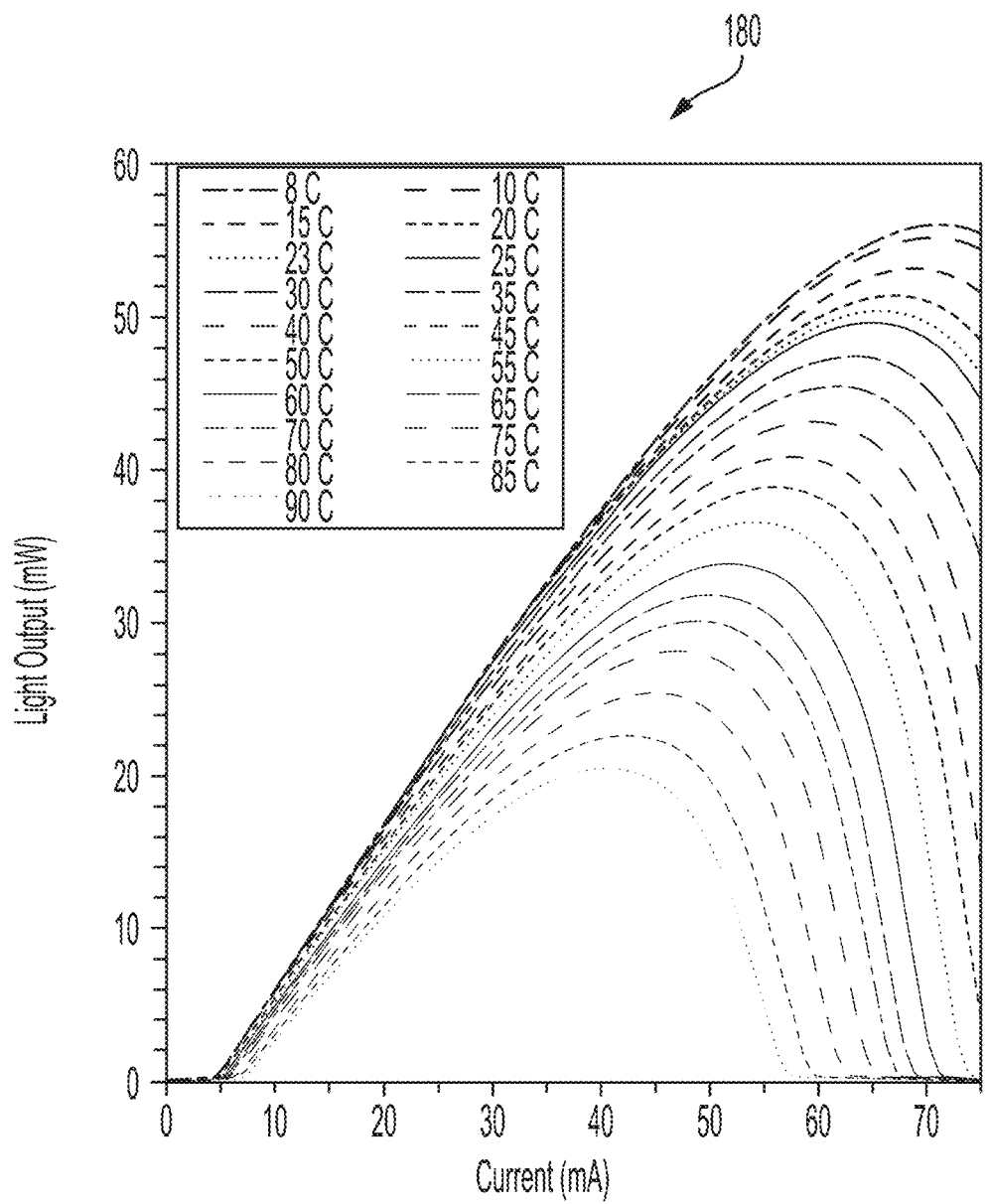
FIG. 9 illustrates a chart of Light Output vs. Current Curves for one dual aperture common anode device at different substrate temperatures showing peak output powers of over 50 mW, in accordance with the embodiments.

Referring to FIG. 8, illustrated is an optical micrograph for a portion of a 1200 dpi laser array 170 utilizing a common anode multi-aperture pixel design, in accordance with the embodiments. The process direction 102 is shown by document icon 101. In this design, a common anode architecture is employed where each address line 115 within the array encompasses multiple electrically-connected apertures 175 to attain a larger effective overall aperture size. The double-aperture "pixel" 175 in this embodiment can fit within a 1200 dpi pitch, yet each pixel (VCSEL 110) is capable of emitting more than 50 mW of light output, as illustrated in the graph 180 provided in FIG. 9, where Light Output vs. Current is graphically depicted. The pixels can be arranged in 4 interdigitated rows addressed from the top and bottom sides.

The multi-row interdigitated arrangement of pixels in FIGS. 1, 6, and 8 can form an effectively tighter linear pitch in a "cross process" direction. In printing applications, an image can be formed row by row as a media traverses across the laser array in the "process direction", along the direction of the address lines. Each row of semiconductor lasers 110 can form a portion of the image. Since each row is spatially separated from other rows, a time delay can be instituted between when the portion of an image from one row is formed relative to other portions from other rows. In FIG. 8, for example, pixels from the top row must be placed adjacent to pixels on the bottom row, followed by pixels from the $2^{nd}$ from the top row and pixels just above the bottom row. If these rows are labeled row A, B, C, and D from top to bottom and if the media is moving along the process direction from the bottom row to the top, then the lasers on row A must be fired after those on row D by a time delay equal to the distance between row A and D divided by the moving speed of the media. The image frames fed to rows A through D must be phase delayed to properly stitch together the image. The print resolution in the process direction can be most conveniently made the same as that of the cross process direction if the separation between rows are multiples of the pixel spacing in the cross process direction.

Figure 10A:
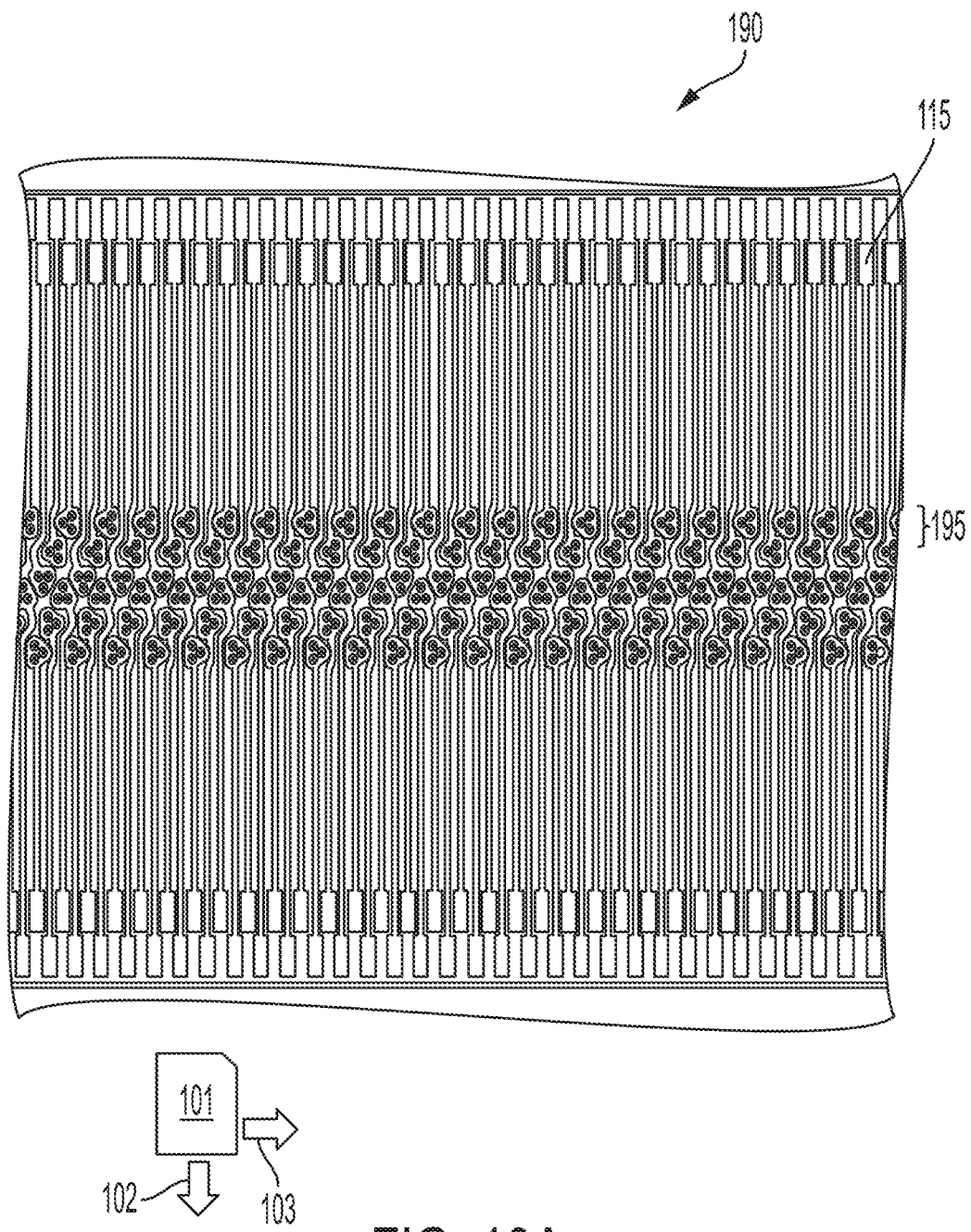
FIG. 10A illustrates an optical micrograph for a portion of a 1200 dpi laser array utilizing a common anode triple-aperture pixel design, in accordance with the embodiments.
Figure 10B:
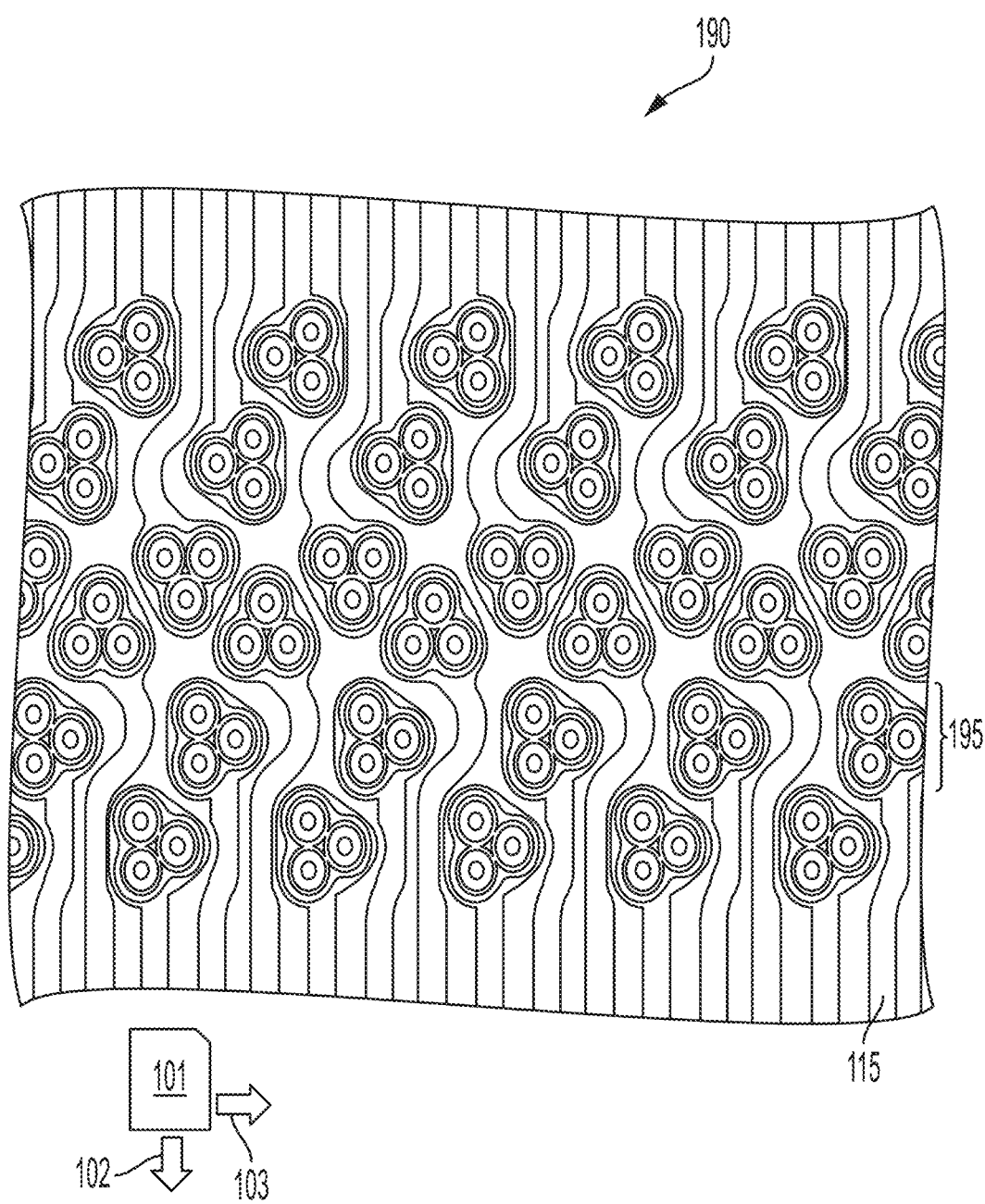
FIG. 10B illustrates a closer view of the triple-aperture pixels of FIG. 10A revealing six levels of staking in a process direction, in accordance with the embodiments.

Referring to FIG. 10A illustrated is an optical micrograph for a portion of a 1200 dpi laser array 190 utilizing a common anode triple-aperture pixel design, in accordance with the embodiments. FIG. 10B illustrates an even closer view of the triple-aperture pixel of FIG. 10A revealing 6 levels of stacking in a process direction, in accordance with the embodiments. The process direction 102 for both Figures is once again shown with the flow of document icon 101. In this design, a common anode architecture can be employed where each address line 115 within the array encompasses three electrically-connected apertures 195 to attain a larger effective overall aperture size for each pixel. In order to accommodate the emitters 110, there can be a six level stacking scheme in process direction implemented. The timing between the activation of horizontally adjacent pixels can be implemented in the driving software. With appropriate timing that accounts for the relative movement of imaged member and laser; the semi-one dimensional positioning of lasers can result in a 1-dimensional printing line.

Mounting, Cooling, Driving, and Imaging VCSEL Array Chips

The tight spacing between lasers in such arrays makes thermal crosstalk problematic, as heat from each laser affects the performance of nearby lasers. Also, the aggregate electrical power draw from a large number of high power lasers operating within a small region leads to a high thermal load density that must be dissipated. Otherwise, the increased temperature will reduce the light output power and can damage the lasers.

These severe thermal management issues can be addressed by developing a direct die attached packaging approach, where the laser array chip is directly die-attached onto a 3D mechanical block, instead of a conventional planar submount. The mechanical block can incorporate embedded cooling fluid channels for flowing cooling fluids such as chilled water or ethylene glycol and functions as a cathode electrical contact for the laser chip. The block can be thought of as a 3D submount with a built-in heat sink. Our 3D submount also features integrated slots for driver chips or electrical interposers and mounting holes for optics mounts. Alternatively, the submount could comprise a heat pipe.

Referring to FIG. 11, illustrated is an illustration 230 of the backside view of a mechanical block 220 showing how cooling fluid tubes 233/235 can be attached to the mechanical block 220 and also showing how integrated mounting holes can be formed therein for attaching optical elements, in accordance with the embodiments. Cooling fluid channels 236 (dashed line) can be embedded inside the body of the mechanical block 220 and can be made to flow coolants close to the heat source for efficient heat removal. FIG.11 also illustrates integrated mounting holes 237 that can be provided for attaching optical elements used for imaging the laser beams.

Focusing Optics

The light output from surface-emitting lasers diverges, so focusing optics are typically needed to structure the light beams and form images. Some commercial GRIN lens array marketed under the name SELFOC lens arrays (SLA) can be configured and used for this purpose. SLAs are well suited for this application because the optical elements can be arranged into a linear arrangement for imaging a set of laser elements that are also arranged in a linear array, such as the ones in applications presented herein.

SLAs are devices that can be used to project a 1:1 image from a source to a substrate. These devices are typically quasi 1-dimensional and are used in scanning applications such as photocopiers, scanners, printers, and fax machines. Typically, SLAs are commercially available in 2-rows of index graded optical elements bonded together in formats and they can be used in some print applications such as LED print bars. Each optical element collects light from a source and projects it on to a substrate. Images from all the optical elements superimpose in order to form the projection of the source onto the substrate. SLAs are attractive because their size can be relatively large so that they become usable for printing applications which typically require wide print width. Commercial SLAs are approximately 12 inch wide. In accordance with the present embodiments, should significantly wider print widths be required, several SLAs could be stitched along the cross-process direction or longer custom SLAs could be produced, or complete VCSEL print bars could be staggered for use in a wide Dali print process.

Figure 12A:
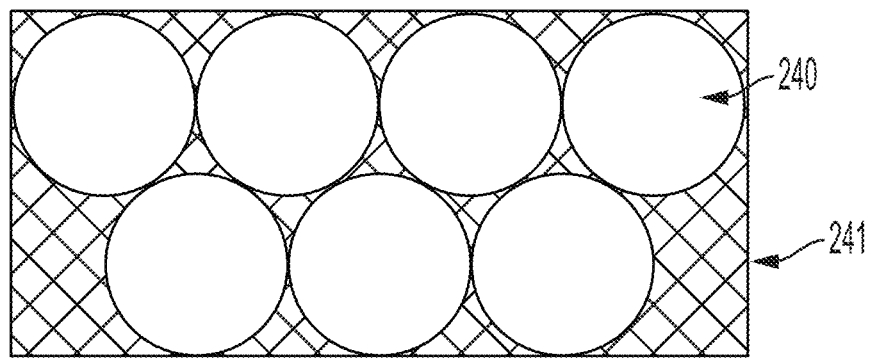
FIG. 12A-12C illustrate front perspectives of lens arrays that can be used with semiconductor laser arrays.

Referring to FIG. 12A, a diagram of a two-row SLA is illustrated. One problem with SLAs is that incident light is either captured by the optical 240 elements or are absorbed by a bonding agent 241 used to secure the optical elements 240. Ideally, a bonding agent would be transparent to the laser light, in particular near infrared light. Approximately 26% of incident light can be absorbed by the bonding agent 241. Therefore, the optical element fill factor is: 2 pi( )/(4+2*sqrt (5))=74%. Many imaging application require little power, so losing 26% of the light is not an issue. Applications, such as thermal processes (e.g., patterned sintering or evaporation), however, require high optical power. For application that require high power, this can create two issues: the SLA can heat up, which then requires a system design and optical design which can tolerate the heat, and energy by the bonding agent 241 is wasted thus requiring more power from the source element to achieve a desired thermal response. An overall light utilization of more than 50% can be considered as well usable for many applications, including thermal processes.

Figure 12B:
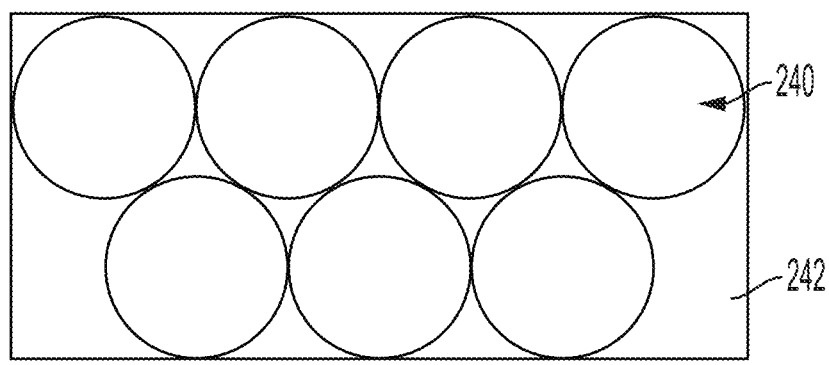
Figure 12C:
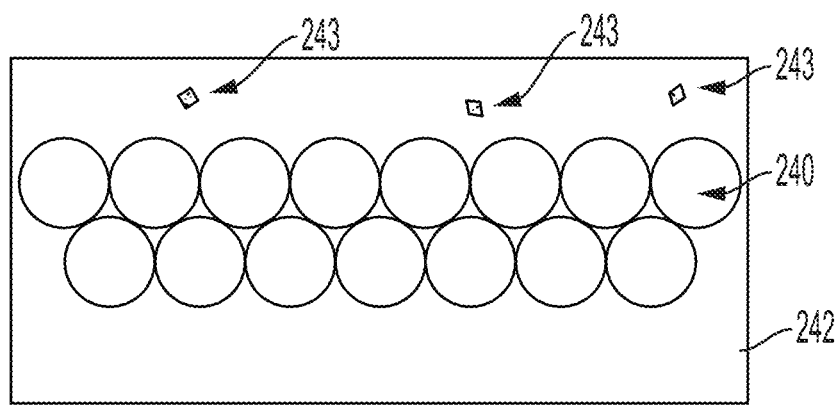

Referring to FIG. 12B, a solution that can overcome the absorption problem with currently available SLAs is to provide an SLA design where the bonding agent can be replaced by a transparent polymer 242. Using this type of bonding agent can allow diffused light to pass through the SLA and be delivered to the substrate. Thermal processes are often threshold dependent. An entire area can be heated, but the desired effect will only be seen where enough energy is present to initiate the thermal process. Diffused light can act as a pre-heat or post-heat to provide thermal offset to the area to be imaged. This can allow some fraction of the 26% lost light to be used in the thermal process and can help keep the SLA cool. Scattering elements 243 can also be incorporated in the bonding agent to accomplish light diffusion. Referring to FIG. 12C, a geometry is shown that can accomplish more diffused light when compared to the geometry illustrated in FIG. 12B, which can provide more focused light.

Figure 12D:
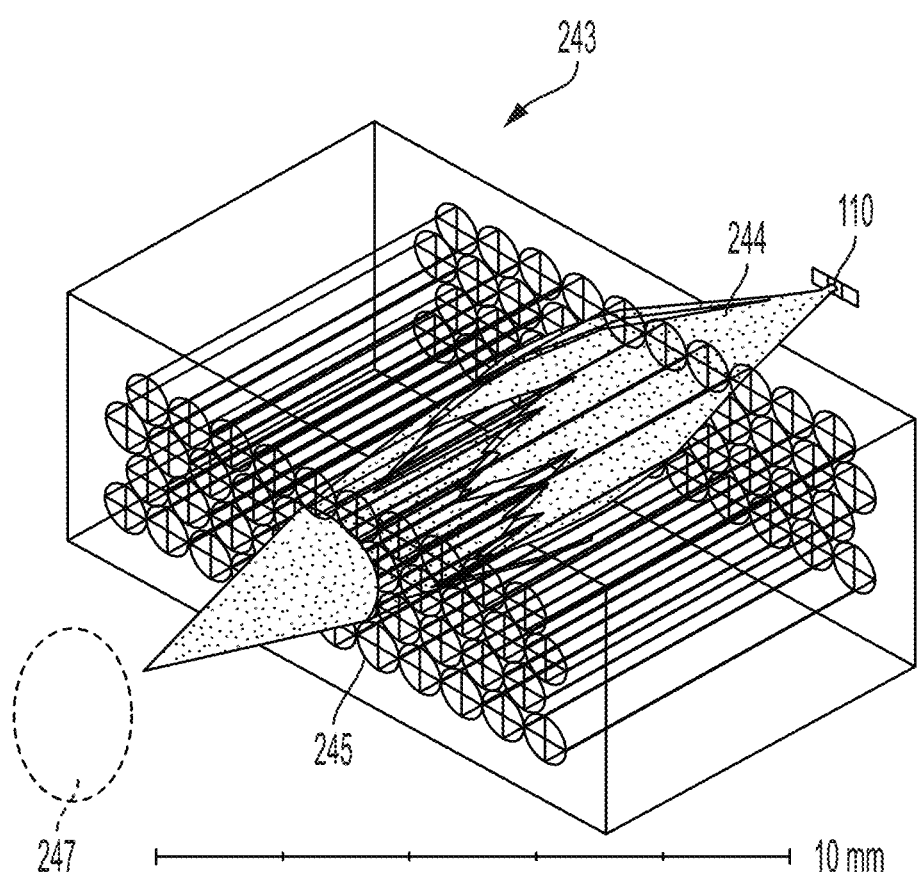
FIG. 12D illustrates a three-point perspective diagram of imaging optics including a 4-row GRIN lens array that can be used with VCSEL arrays described herein, in accordance with the embodiments.
Figure 13:
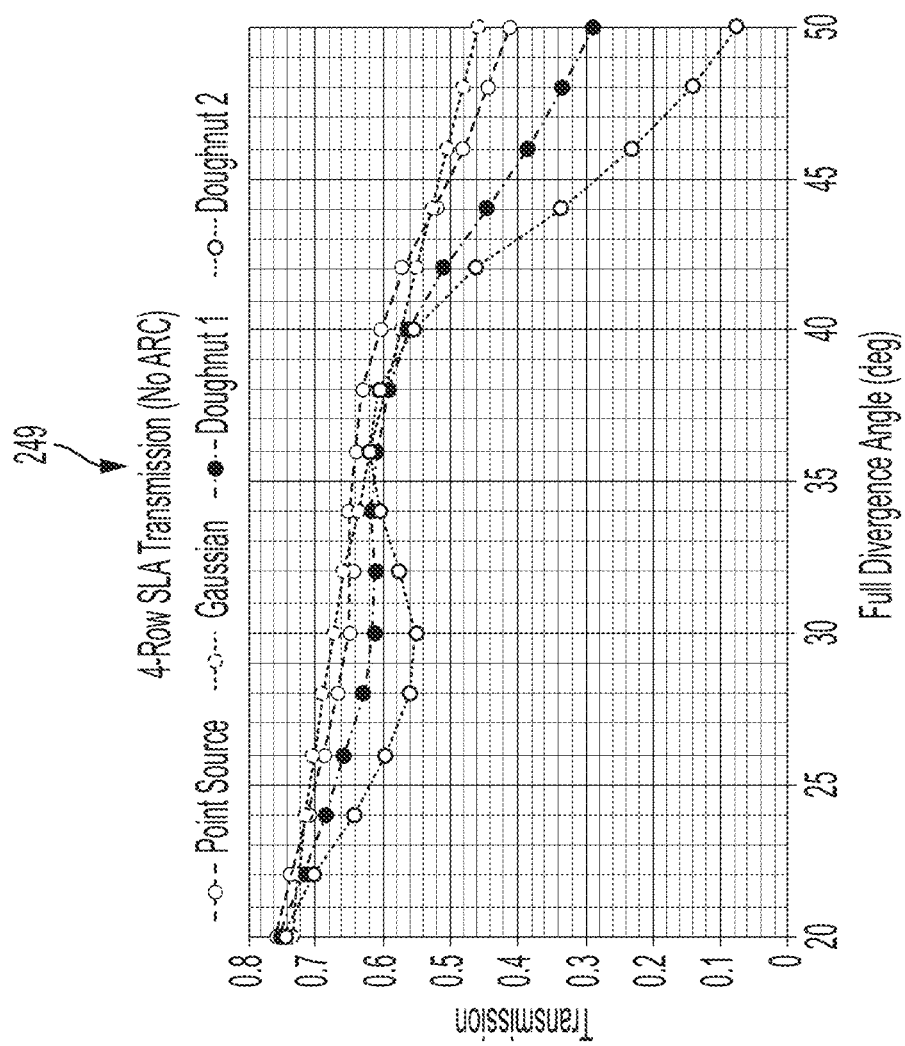
FIG. 13 illustrates a graph for calculated Optical Throughout vs. Source Beam Divergence for different laser spatial mode profiles, in accordance with the embodiments.

Referring to FIG. 12D, illustrated is a three-point perspective diagram 243 of imaging optics including a 4-row GRIN lens array that can be used with VCSEL arrays described herein, in accordance with the embodiments. FIG. 12D illustrates an example implementation utilizing a 4-row GRIN-lens array. The light path 244 from each laser 110 can traverses several lens elements 245 and converge on an image plane 247. FIG. 13 illustrates a graph 249 of the calculated Transmission efficiency vs. beam Divergence for different laser spatial mode profiles. The optical throughput can be limited by the imperfect fill factor of the GRIN lens array, as light that lands on the material at the gaps between the cylindrical optical elements is lost. Diverging light that is not captured by the lens array is also lost, so it is beneficial to use the enough rows if lenses to capture ideally all the light emanating from the VCSEL array.

Figure 14A:
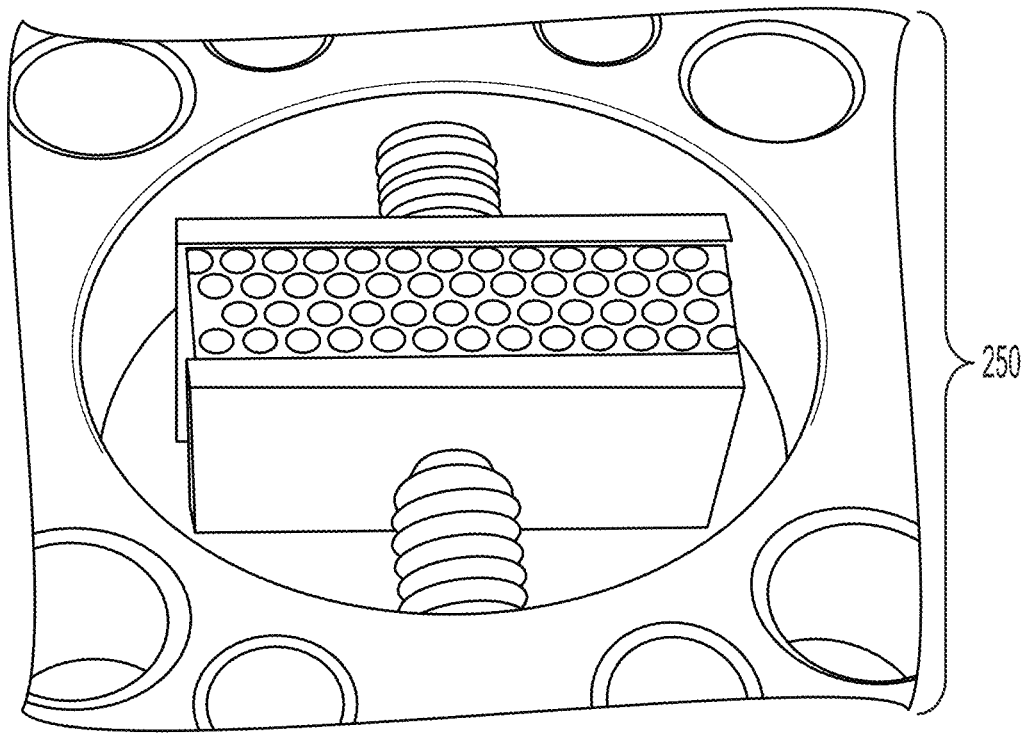
FIG. 14A is a photograph of a four row GRIN-lens array (GLA) constructed from two modified 2-row SLAs, in accordance with the embodiments.
Figure 14B:
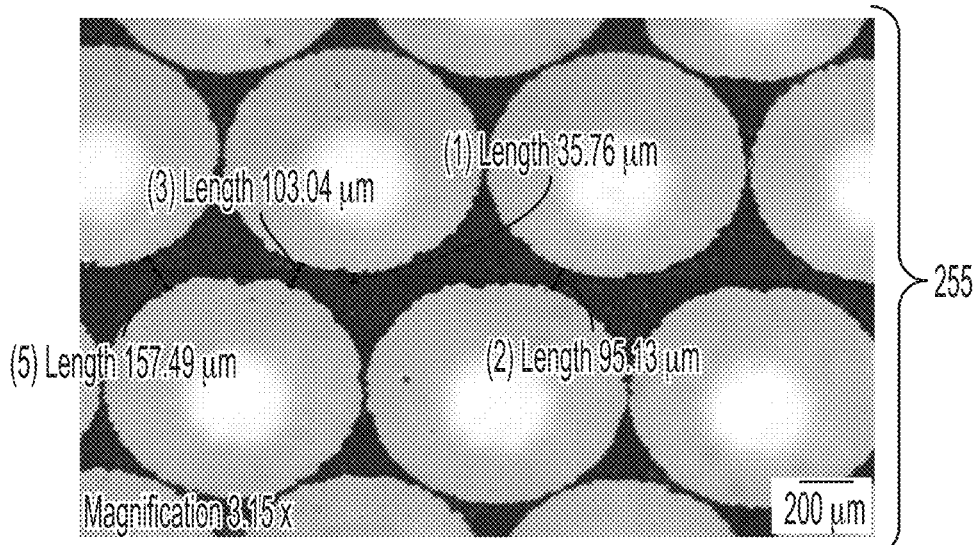
FIG. 14B illustrates an optical micrograph of the combined 2-row GLAs of FIG. 14A, in accordance with the embodiments.

A larger number of lens rows can be constructed from commercially available 2-row SLAs by removing the cladding from one side of the SLA, polishing away the cladding residues, and pressing two modified SLAs together. Referring to FIG. 14A, illustrated is a photograph 250 of a four row SLA constructed from two modified 2-row SLAs, in accordance with the embodiments. Referring to FIG. 14B, illustrated is an optical micrograph 255 of the combined 2-row SLAs 250 depicted in FIG. 14A.

Alternative Focusing Optics

Figure 15A:
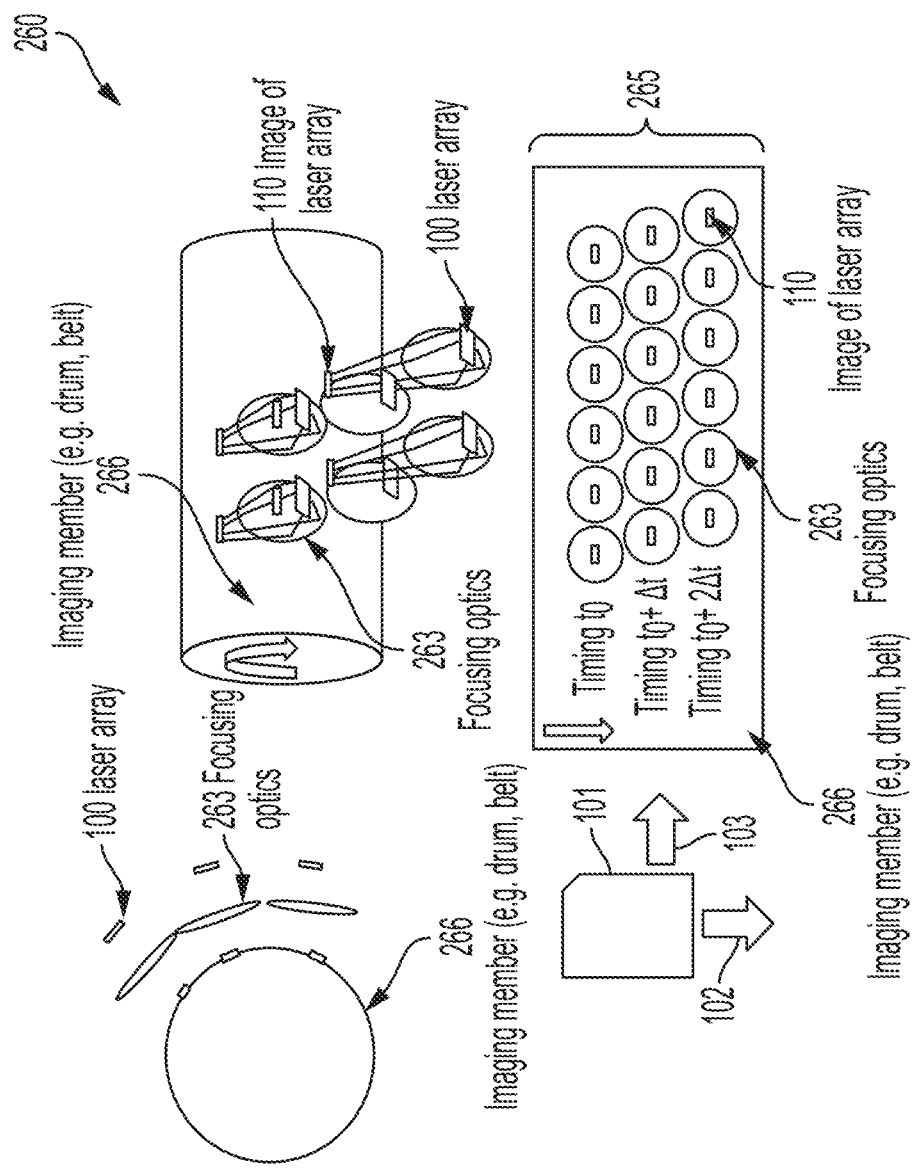
FIG. 15A illustrates a block diagram of staggered imaging system for laser arrays, in accordance with the embodiments.

In many cases the desired print width makes a classical imaging system too large. Instead of using SLAs to focus an image 110 of individual VCSEL lasers of a laser array 100 on a blanket cylinder 266, it also can be possible to use different optical elements such as classical focusing lenses 263. These types of lenses or lens combinations create inverted images of an object. Referring to FIG. 15A, illustrated is a block diagram of a staggered imaging system 260 for focusing output from VCSEL laser arrays 100, in accordance with the embodiments. It can be necessary to stagger individual imaging systems 100 in a sawtooth pattern as illustrated in FIG. 15A. Each row in the staggered system is activated with an appropriate timing delay 265 (e.g., $t_0$, $t_0+\Delta t$, $t_0+\Delta 2t$) so the aggregate exposures made on the moving imaging member 266 are properly stitched to form the intended image.

Figure 15B:
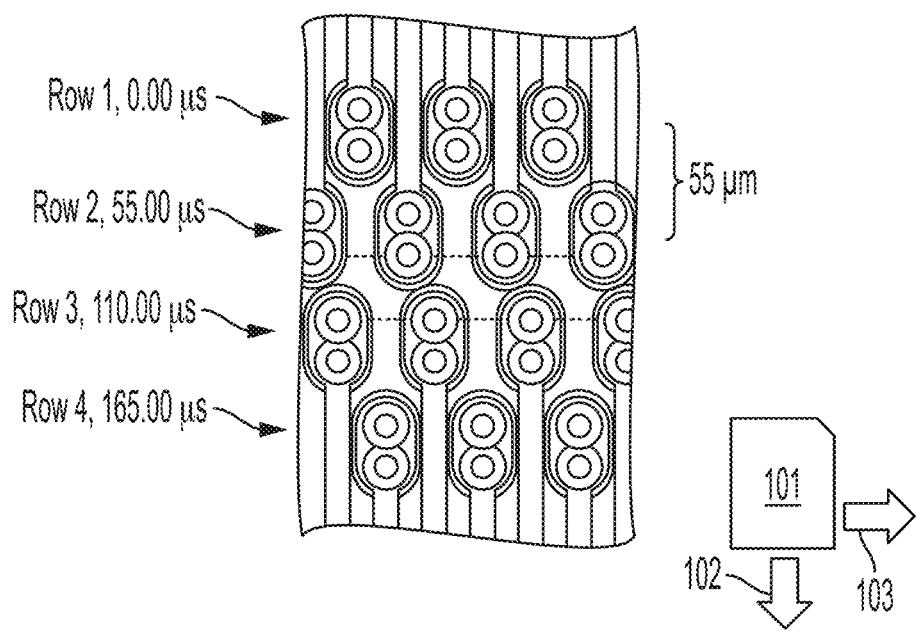
FIG. 15B illustrates an example of VCSEL scroll timing using a four-row VCSEL laser array 170 with double apertures, in accordance with the embodiments.

Referring to FIG. 15B, an example of VCSEL scroll timing using a four-row VCSEL laser array 170 with double apertures (see FIG. 8) is shown where a document 101 is being processed in the process direction 102 at 1 m/sec, with 55 μm row spacing (center to center) between VCSEL rows. As the document 101 is being processed in the processing direction 102, pixels in each row will illuminate at different times in accordance with a reference image in order to accommodate distance between pixels based on their row assignment. Pixels in row 1 is shown illuminating with timing equal to 0.00 microseconds, while pixels in row 2 are shown to illuminate at 55.00 microseconds, with row 3 at 110.00 microseconds, and row 4 at 165.00 microseconds. Thus, accounting for delays as described can enable image stitching accuracy during document processing.

Figure 16:
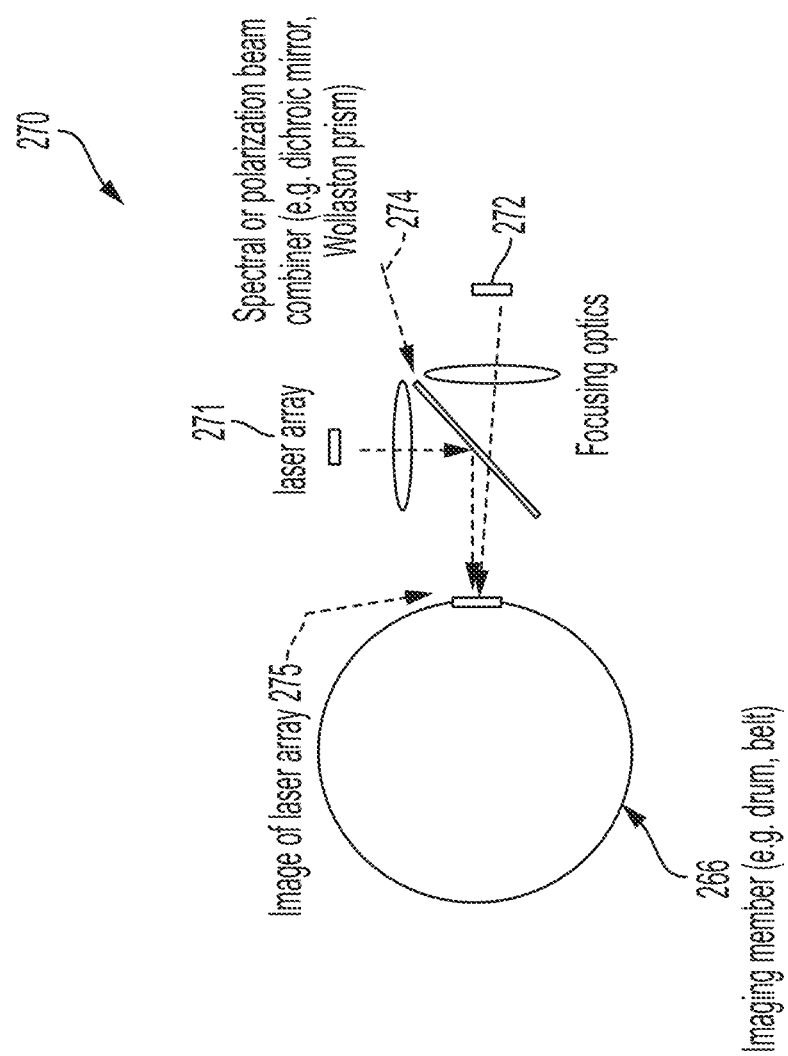
FIG. 16 illustrates a feathered imaging system for laser arrays, in accordance with the embodiments.

Referring to FIG. 16, illustrated is a feathered imaging system 270 for focusing output from laser arrays 100, in accordance with the embodiments. Focusing of output can be achieved by interleaving the individual laser arrays 271/272 into an at least partially shared imaging path 275 onto an imaging member 266 (e.g., drum) as illustrated in FIG. 16, by combining beams using a beam combiner such polarization optics 274 or dichroic mirrors or both. A combination of polarization and spectral beam combiners, as well as a cascade of beam combiners could be used to combine images.

Figure 17:
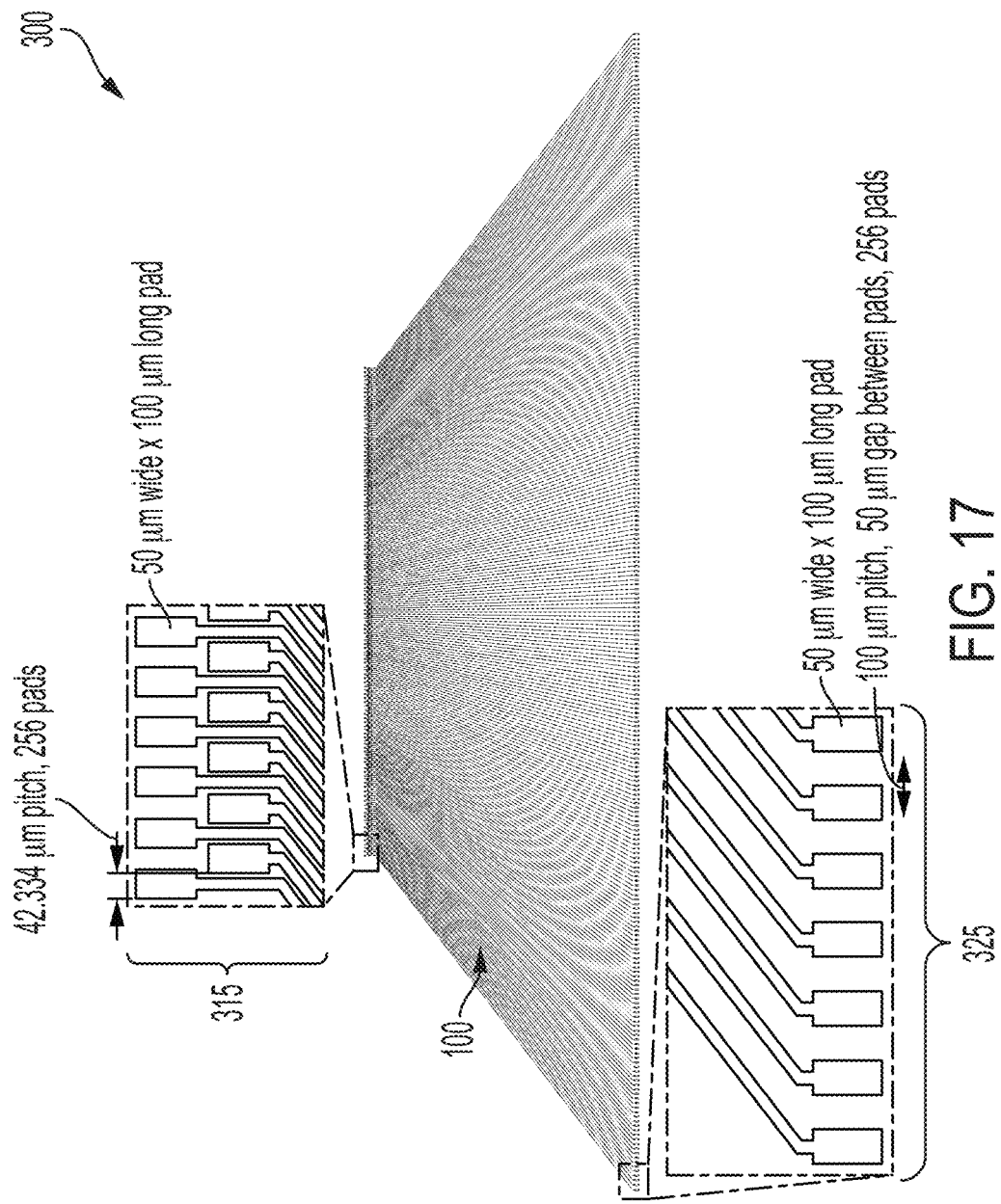
FIG. 17 illustrates an electrical thin film routing layout of an interposer chip architecture that fans out tight-pitch contact pads on a laser array to wider-pitch contacts on a PCB or on a driver chip, in accordance with the embodiments.

Referring to FIG. 17, illustrated is a block diagram of an interposer chip architecture 300 that fans out tight-pitch contact pads 315 on a laser array 100 to wider-pitch pads 325 on a PCB or on a driver chip, in accordance with the embodiments. For high resolution printing applications such as 1200 dpi or higher, the required laser array pitch is very tight compared to the typical dimensions of pads and pad spacing in state-of-the-art PCBs. In some implementations, an interposer chip 300 that fans out electrical contacts 315 from the laser chip 100 to match a wider-pitched set of contact pads on a PCB or a driver chip can be used. FIG. 17 illustrates an example of an embodiment where an interposer is employed to fan out the contact pads 315 on 42 μm pitch to 100 μm pitch pads 325.

There is an alternative interposer design that can fan the contact pitch in, rather than out. In such designs, the VCSEL array pads can be mapped to corresponding tighter-pitch pads, say, on the output of a driver chip (ASIC). The fan-in arrangement allows the driver chip to be made smaller than the laser array chip, thus providing placement tolerance when aligning and tiling driver chips for addressing tiled laser array chips 100 like those in FIG. 3.

Substrate Thinning

In certain applications, the ability to directly attach the laser array chip 210 onto a large highly thermally conductive block 220 is essential for preventing thermal overload, because a traditional 2D planar submount would add unacceptable thermal resistance between the laser chip 210 and a heat sink. In the presented cooling design as described with respect to FIG. 11, highly concentrated heat generated within the small area of the laser chip 210 can quickly enter the copper block 220, spread across the large area of the block 220, and can be dissipated out of the system via fast-flowing coolant fluids running through tubes 233/235.

The semiconductor laser substrate is typically highly thermally resistive compared to a metal block, so the substrate can present a significant bottleneck to thermal flow from heat generated at the lasers. Thermal modeling indicates that thinning the substrate from a conventional 150 μm thick layer to 40 μm can reduce the temperature at the laser by 12° C. during operation, assuming a coolant flow rate of 4 liters per minute. This can translate into a light output power improvement of about 10%. The temperature at the laser can be reduced further with the use of thinner substrates down to a substrate thickness of 20 μm.

Figure 18A:
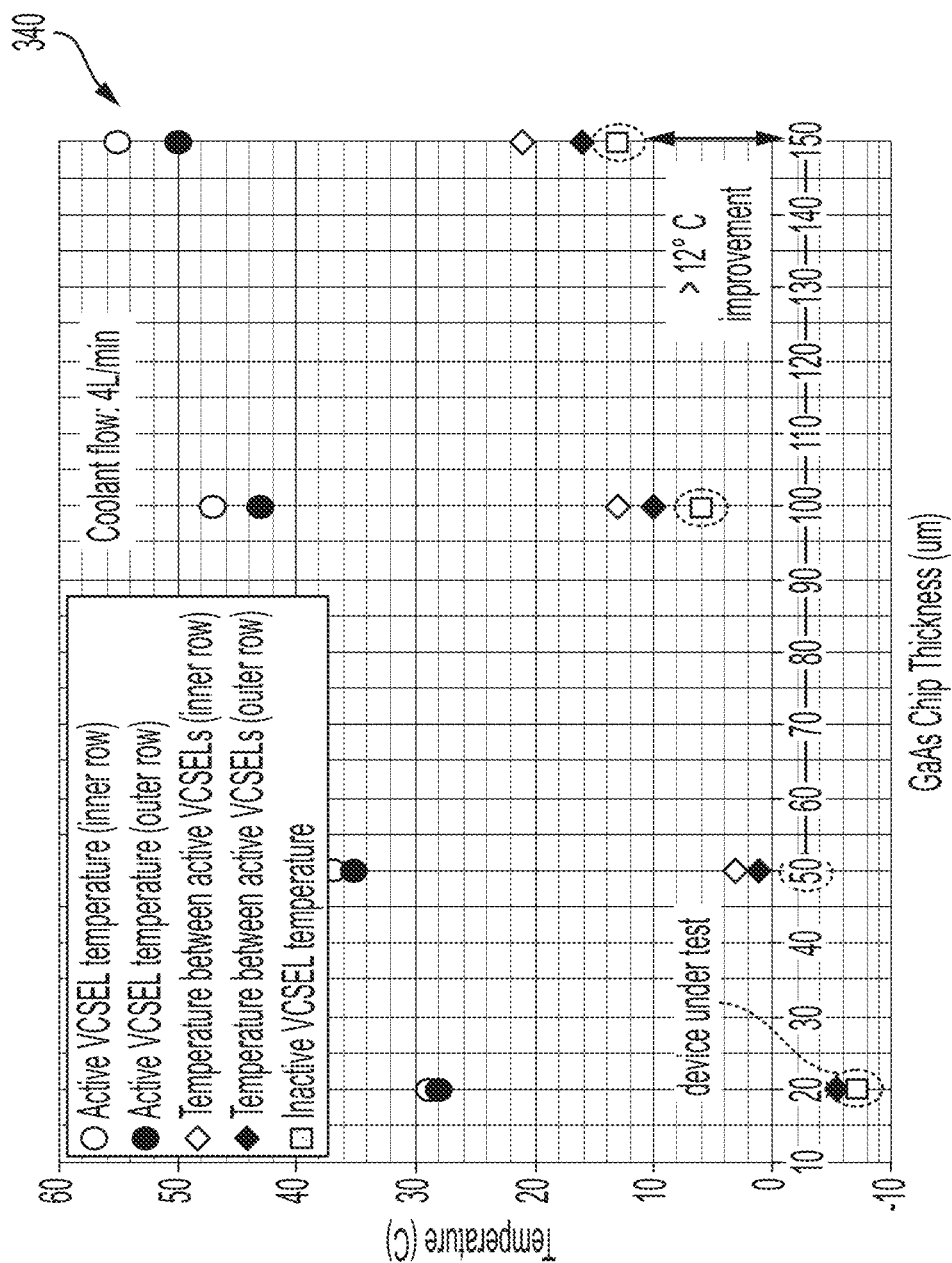
FIG. 18A illustrates a graph of Calculated Temperature vs. Substrate Thickness at different locations of a laser chip surface, in accordance with the embodiments.
Figure 18B:
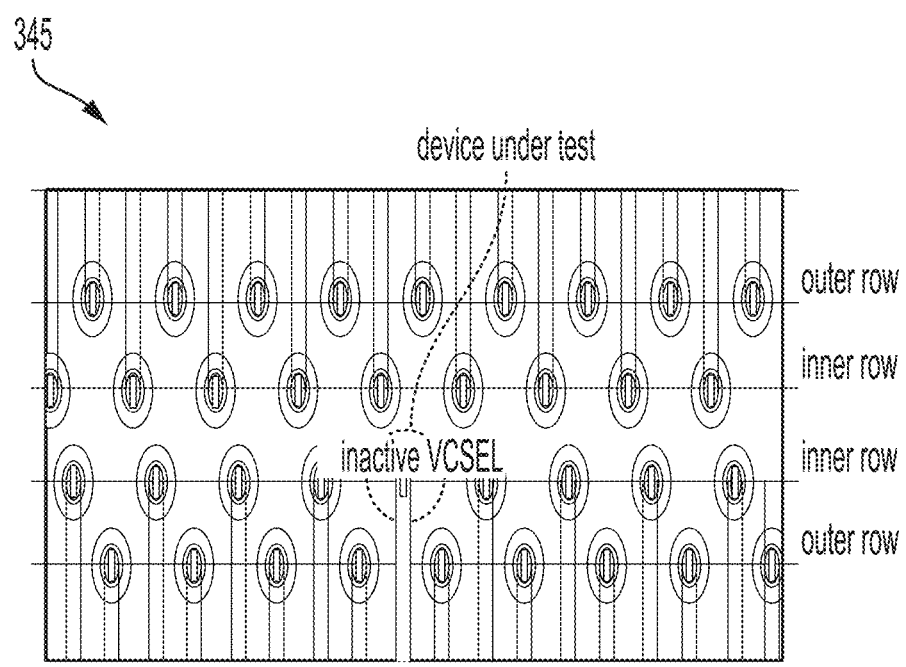
FIG. 18B illustrates a layout of a laser chip surface with a temperature profile shown across its surface, in accordance with the embodiments.

FIG. 18A illustrates a graph 340 of Calculated Temperature vs. Substrate Thickness at different location of a laser ship surface, in accordance with the embodiments. The calculation assumes the laser array geometry shown in FIG. 1, the 3D submount design shown in FIG. 3, an ethylene glycol coolant temperature of −10° C., and a coolant flow rate of 4 L/min. FIG. 18B illustrates a diagram 345 if the temperature profile across the laser chip surface corresponding to the plot points shown in FIG. 18A. The device under test was an off-state device and the temperature at that location was calculated when all lasers in the array are turned on to full power. This temperature is a measure of thermal crosstalk and of the effect of neighboring lasers on the performance of the device under test.

Figure 19A:
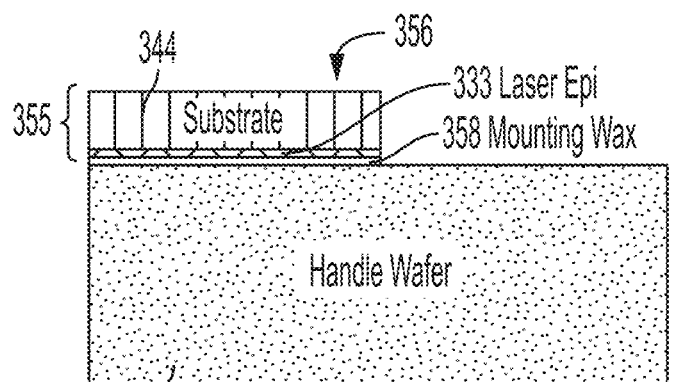
FIG. 19A to FIG. 19E illustrates process steps for transferring a VCSEL array epi to a metal host substrate, in accordance with the embodiments.
Figure 19B:
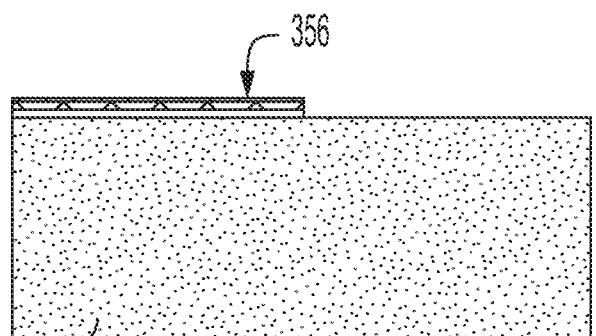
Figure 19C:
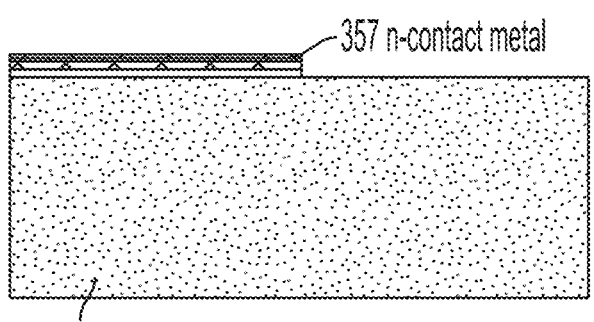
Figure 19D:
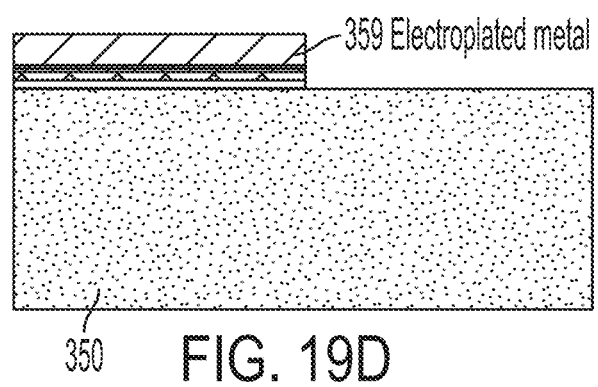
Figure 19E:
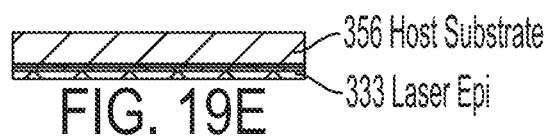

A 20 μm-thick layer is in the order of the thickness of the VCSEL epitaxial layers, so the substrate thinning task is tantamount to removing the epi material from its native substrate and transferring it to a host metal substrate. FIGS. 19A to 19E illustrate a process for achieving this task. The first step comprises mounting the laser chip 355 including substrate 344, backside 356 facing upward, and with mounting wax 358 onto a planar handle wafer 350, such as glass or silicon, as illustrated in FIG. 19A. Then as shown in FIG. 19B, the backside 356 is chemical-mechanically polished so only 20 μm of materials remains. For GaAs substrates, the polishing step can be performed using sodium hypochlorite in conjunction with a rotating soft pad. Thickness control can be achieved using a mechanical stop designed into part of the substrate holder. Alternatively, the GaAs substrate can be selectively removed by employing an etch stop layer in the epilayer stack in combination with a chemical etchant that etches GaAs faster than the etch stop layer. For example, a thin layer of AlGaAs can be used as an etch stop against $NH_4OH/H_2O_2$. Another example utilizes GaInP as an etch stop against $HNO_3/H_2O_2$. The handle wafer 350 can then be removed from a polishing jig and placed into a thin film evaporator. In the evaporator, an n-type ohmic contact metal 357 such as AuGe can be blanket deposited on the polished backside 356 of now thinned substrate 344, as shown in FIG. 19C. Next, as shown in FIG. 19D, the backside metal film can be used as an electroplating seed for electroforming of a layer of electroplated metal 359 that replaces the removed substrate. The electroplated metal 359 can be, for example, a 50 μm-thick layer of copper. Then, as illustrated in FIG. 19E, the handle wafer 350 can be removed by dissolving the mounting wax 358 in a solvent such as acetone, which will enable the handle wafer 350 to be removed from the modified laser chip 355. This step can leave the electroplated metal 359 holding the transferred laser epi 333. The host substrate 356 and the transferred laser array 333 can then be annealed to complete the n-side ohmic contact interface. The completed structure can then be die attached to a mechanical block 220 as previously described.

VCSEL Array Printing Application Example

Not meant as a limitation for application herein disclosed embodiments, as mentioned hereinbefore, the use of VCSEL arrays as an individually addressable light source in, for example, digital architecture for lithographic inks (DALI) printing systems. DALI print processing has the advantage of a dramatically reduced size, cost, and complexity of the most sophisticated component—the laser imager.

FIG. 20 illustrates a schematic diagram of a prior art digital printing system 370 that includes an imaging member 266. The digital printing system 370 can be implemented as a system for variable lithography. The imaging member 266 in the example depicted in FIG. 20 may be a drum, a plate, or a belt, or another now known or later developed configuration.

The imaging member 266 can be used to apply an ink image to an image receiving media substrate 114 at a transfer nip 112. The transfer nip 112 can be formed by an impression roller 118, as part of an image transfer mechanism 160, exerting pressure in the direction of the imaging member 266. The image receiving media substrate 114 should not be considered to be limited to any particular composition such as, for example, paper, plastic, or composite sheet film. The digital printing system 370 may be used for producing images on a wide variety of image receiving media substrates.

The imaging member 266 can include a reimageable surface layer formed over a structural mounting layer that may be, for example, a cylindrical core, or one or more structural layers over a cylindrical core.

The digital printing system 370 can include a fountain solution system 122 that involves a series of rollers, which may be considered as dampening rollers or a dampening unit, for uniformly wetting the reimageable surface of the imaging member 266 with dampening fluid. A purpose of the fountain solution system 122 is to deliver a layer of dampening fluid, generally having a uniform and controlled thickness, to the reimageable surface of the imaging member 266.

As indicated above, it is known that a dampening fluid such as fountain solution may comprise mainly water optionally with small amounts of isopropyl alcohol or ethanol added to reduce surface tension as well as to lower evaporation energy necessary to support subsequent laser patterning, as will be described in greater detail below. Small amounts of certain surfactants may be added to the fountain solution as well. Alternatively, other suitable dampening fluids may be used to enhance the performance of ink based digital lithography systems.

Once the dampening fluid is metered onto the reimageable surface of the imaging member 266, a thickness of the dampening fluid may be measured using a sensor 125 that may provide feedback to control the metering of the dampening fluid onto the reimageable surface of the imaging member 266 by the fountain solution system 122.

After a precise and uniform amount of dampening fluid is provided by the fountain solution system 122 on the reimageable surface of the imaging member 266, an optical patterning subsystem 130 may be used to selectively form a latent image in the uniform dampening fluid layer by imagewise patterning the dampening fluid layer using, for example, laser energy. Typically, the dampening fluid may not absorb the optical energy (IR or visible) efficiently. The optical patterning subsystem 130 can be implemented as or may include a light source 131 (e.g., a vertical cavity surface emitting (VCSEL) array, a light emitting diode (LED) array, a laser light source that emits the pixilated light beam as a pixelated line laser beam, or a modulated laser line source).

The reimageable surface of the imaging member 266 should ideally absorb most of the laser energy (visible or invisible such as IR) emitted from the optical patterning subsystem 130 close to the surface to minimize energy wasted in heating the dampening fluid and to minimize lateral spreading of heat in order to maintain a high spatial resolution capability. Alternatively, an appropriate radiation sensitive component may be added to the dampening fluid to aid in the absorption of the incident radiant laser energy.

While the optical patterning subsystem 130 is described above as being or including a light source such as a laser emitter, it should be understood that a variety of different systems may be used to deliver the optical energy to pattern the dampening fluid.

The mechanics at work in the patterning process undertaken by the optical patterning subsystem 130 are known to those in the art. Briefly, the application of optical patterning energy from the optical patterning subsystem 130 can result in selective removal of portions of the layer of dampening fluid.

Following patterning of the dampening fluid layer by the optical patterning subsystem 130, the patterned layer over the reimageable surface of the imaging member 266 can be presented to an inker subsystem 145. The inker subsystem 145 can be used to apply a uniform layer of ink over the layer of dampening fluid and the reimageable surface layer of the imaging member 266. The inker unit 145 can further include heated ink baths whose temperatures can be regulated by a temperature control module (not shown in FIG. 20). The inker subsystem 145 can use an anilox roller to meter an offset lithographic ink onto one or more ink forming rollers that can be in contact with the reimageable surface layer of the imaging member 266. Separately, the inker subsystem 145 can include other traditional elements such as a series of metering rollers to provide a precise feed rate of ink to the reimageable surface. The inker subsystem 145 can deposit the ink to the pockets representing the imaged portions of the reimageable surface, while ink on the unformatted portions of the dampening fluid will not adhere to those portions.

The cohesiveness and viscosity of the ink residing in the reimageable layer of the imaging member 110 can be modified by a number of mechanisms. One such mechanism, for example, can involve the use of a rheology (complex viscoelastic modulus) control subsystem 155. The rheology control system 155 can form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink can be then transferred from the reimageable surface of the imaging member 266 to a substrate of image receiving medium 114 using a transfer subsystem 160. The transfer occurs as the substrate 114 is passed through a nip 112 between the imaging member 266 and an impression roller 118 such that the ink within the voids of the reimageable surface of the imaging member 266 is brought into physical contact with the substrate 114. With the adhesion of the ink having been modified by the rheology control system 155, modified adhesion of the ink causes the ink to adhere to the substrate 114 and to separate from the reimageable surface of the imaging member 266. Careful control of the temperature and pressure conditions at the transfer nip 112 can allow transfer efficiencies for the ink from the reimageable surface of the imaging member 266 to the substrate 114 to exceed 95%. While it is possible that some dampening fluid may also wet substrate 114, the volume of such a dampening fluid will be minimal and will rapidly evaporate or be absorbed by the substrate 114.

In certain offset lithographic systems, it should be recognized that an offset roller (not shown in FIG. 20) can first receive the ink image pattern and then transfer the ink image pattern to a substrate according to a known indirect transfer method. Following the transfer of the majority of the ink to the substrate 114, any residual ink and/or residual dampening fluid must be removed from the reimageable surface of the imaging member 266, preferably without scraping or wearing that surface. An air knife may be employed to remove residual dampening fluid. It is anticipated, however, that some amount of ink residue may remain. Removal of such remaining ink residue may be accomplished through use of some form of cleaning subsystem 172. The cleaning subsystem 172 can comprise at least a first cleaning member such as a sticky or tacky member in physical contact with the reimageable surface of the imaging member 266, the sticky or tacky member removing residual ink and any remaining small amounts of surfactant compounds from the dampening fluid of the reimageable surface of the imaging member 266. The sticky or tacky member can then be brought into contact with a smooth roller to which residual ink may be transferred from the sticky or tacky member, the ink being subsequently stripped from the smooth roller by, for example, and a doctor blade.

Other mechanisms by which cleaning of the reimageable surface of the imaging member 266 can be facilitated. Regardless of the cleaning mechanism, however, cleaning of the residual ink and dampening fluid from the reimageable surface of the imaging member 266 can be essential to preventing so-called 'ghosting'. Once cleaned, the reimageable surface of the imaging member 266 can be again presented to the fountain solution system 122 by which a fresh layer of dampening fluid can be supplied to the reimageable surface of the imaging member 266, and the process can be repeated.

In the prior art digital printing system 370 shown in FIG. 20, a blanket 113 (i.e., an 'imaging cylinder blanket' or 'imaging blanket') is shown. The imaging member 266 in the form of a printing plate can surround the cylindrically shaped blanket 113. The blanket 113 with the imaging member 266 in the form of a printing plate shown in the FIG. 20 example can rotate in the direction indicated by curved arrow 117.

The ink must be compatible with materials that it comes into contact with, including the imaging member 266, fountain solution applied by fountain solution system 122, and other cured or non-cured inks. The ink should also meet all functional requirements of the sub-systems, including wetting and transfer properties. Transfer of the imaged inks is challenging, as the ink must at once wet the blanket material homogeneously (e.g., imaging member 266), and transfer from the blanket 113 to the substrate (112, 114, and 118). Transfer of the image layer must be very efficient, at least as high as 90%, as the cleaning sub-station can only eliminate small amounts of residual ink. Any ink remaining on the blanket after cleaning would result in an unacceptable ghost image appearing in subsequent prints. Not surprisingly, ink rheology plays a key role in the transfer characteristics of an ink.

DALI print systems involve the use of DALI print process high power lasers and the ability to modulate them in a pixel-by-pixel fashion to produce latent fountain solution images that can be used to ink a printing blanket. A DALI system can enable the digital printing of high viscosity inks with high resolution. Such a high quality printing process can combine the inherent advantages of high pigment loading, low solvent content, inexpensive inks with the capability of printing with these inks in a digital fully customizable manner for each pixel in each print.

In the DALI printing process, a continuous thin layer (e.g., tens of nanometers) of fountain solution, which can be deposited on the surface of the printing blanket, rejects the transfer of ink to the blanket 113 (in particular imaging member 266). A high-power laser can be used to heat the surface region of the optically absorbing blanket and thereby evaporate the fountain solution in an image-wise pattern. The laser must, however, heat the blanket sufficiently to supply the latent heat of evaporation as well as the sensible heat to raise the fluid to its evaporation temperature (e.g., ~175 C). The evaporated areas can be then inked, and the ink can be transferred to a receiving medium.

Although existing DALI printing systems can enable the digital printing of high viscosity inks with a high resolution, the current DALI printing process can be relatively expensive due to the cost of high-power lasers and their modulation devices. Solutions such as those described with respect to the embodiments described herein are thus needed to reduce costs significantly for DALI printing systems.

A design drawing of a completed VCSEL array-based imaging member 380 is depicted in the perspectives presented in FIGS. 21A and 21B. A macro interposer PCB 225 is shown attached to the VCSEL cooling block 220. A VCSEL array 210 is shown attached to the VCSEL cooling block 220 and a GRIN lens array 240 is shown aligned with the VCSEL array 210 and positioned opposite the VCSEL cooling block 220. In addition to the described elements, FIGS. 21A/21B can also include a vapor extraction unit 388 that is mounted to a vapor extraction mount 387 and placed close to the focus area (output) of the GRIN lens array 240. In some embodiments the vapor extraction unit 388 can include a vacuum blade 389 or a physical blade or both. The vapor extraction unit 388 can extract fountain solution vapor generated by selective laser heating during the process of digitally structuring the fountain solution. FIG. 21B depicts a generally location for wire bonds 382 and a VCSEL interposers 381/384, as well as a focal plane 360 which would typically be adjusted to be located on the blanket cylinder 375. FIG. 21A shows a location where vapor extraction adjustment 383 can occur. Furthermore, as depicted in FIG. 11 a cooling fluid tube 233, which can provide coolant to the VCSEL cooling block 220, may be attached to the block.

Referring to FIG. 22, illustrated is a block diagram 400 of electronic modules operating as part of a printing system, in accordance with the embodiments. Electronic modules as shown can provide system functions of the application specific integrated circuit (ASIC) driver chips 135 mentioned with respect to FIG. 3 and the discussion thereafter. Electronic modules as shown can together enable a system for controlling and driving independently addressable semiconductor lasers. A computer 405 can be provided that can convert images into raw data and provides it to a control interface 410. The control interface 410 can then transmit raw data and timing to driver electronics 415. A current driver 415 can convert raw data with timing information provided by the control interface 410 into regulated current signals. Then, a VCSEL array 420 can convert the current signals into light used to illuminate an imaging member 266 (see FIG. 15A).

Referring to FIGS. 23A-B, illustrated is a block diagram 450, which is just one example of the functional states that could be implemented in the control interface circuit. The control interface circuit can ingest streams of image data for each row of VCSEL devices from the computer and convert them into timing signals and properly timed raw data for the current driver circuit to power the VCSEL devices in a manner to produce the desired print output. The interface circuit requires streams of image data, as well as system information including, but not limited to, print media speed, print media acceleration, deceleration, and device to device variation in VCSEL power. In the idle state 460 the control interface is typically waiting for image data from the computer. In the Print Setup State 470 the control interface circuit receives and buffers pre-formatted image data stream from the computer for each VCSEL row in preparation to produce the desired print output. In the Print Lines state 451-454, data for each row of a 4 row VCSEL array is responsive to subframe delay 458 data to produce a properly stitched and timed image on the drum. Each print line can process data and timing information using display line, send next line and memory access modules based on image processing data received from a print setup 470 module. After document processing, the system can revert back 459 to an idle state 460 an await additional/new processing requirements.

Referring to FIG. 24, a block diagram 500 is illustrated representing functions that can occur in primary modules of a printing system where VCSEL array usage is incorporated, in accordance with the embodiments. As depicted at Block 503, an image can be converted into 4 data streams (A,B,C, and D) to accommodate each of the 4 rows of the VCSEL array. Concurrently with this, timing information is converted to clock pulse values and sent to FPGA memory where current set point are set, as illustrated at Block 505. Image data is buffered into FPGA memory using DMA function as shown in Block 510, while timing information is retrieved from FPGA memory and stored in FPGA registers as shown in Block 513. Then, as indicated at Block 515, electrical current setpoint information can be stored in dot correction registers at the print module in preparation for further document processing/rendering using VCSELs.

Referring to FIG. 25, illustrated is another block diagram 550 representing functions that can occur in electronic modules of a printing system where VCSEL array usage is incorporated, in accordance with the embodiments. As shown at block 555, a print start and stop operation can be initiated at the computer after processing or implementation of the steps described with respect to FIG. 24. As depicted at Block 560, image data can be retrieved from FPGA memory for each print line and can be formatted and shifted out of the FPGA to the module. Concurrently, as indicated at Block 563, control (CNTRL) signals can be raised and lowered for each group (ABCD) based on timing values stored in registers. Thereafter, as illustrated at Block 565, current outputs can be activated according to values in Gray Scale registers at the start of the cycle for each print line. Furthermore, while currents are being output, next line data is being shifted into Gray Scale Registers.

In summary, structures and methods are disclosed herein for realizing tight-pitch independently-addressable high power surface-emitting laser arrays. Also described herein are associated components and methods that can enable the use of such laser arrays in printing applications.

It will be appreciated that variations of the above-disclosed and other features and functions, or alternatives thereof, may be desirably combined into many other different systems or applications. It will also be appreciated that various presently unforeseen or unanticipated alternatives, modifications, variations, or improvements therein may be subsequently made by those skilled in the art which are also intended to be encompassed by the following claims.

What is claimed is:

1. Focusing optics, comprising:
    a plurality of optical elements disposed in at least two interdigitated rows and bonded with a bonding agent in a linear arrangement with half of addressing trace lines coming from a top side and the other half of the addressing trace lines coming from a bottom side, the plurality of optical elements configured to pass light from a semiconductor laser array comprising at least 100 individually addressable lasers through the plurality of optical elements and to illuminate a target with the light of the semiconductor laser array; and
    a metal block with high thermal conductivity, wherein the plurality of optical elements and the semiconductor laser array are thermally coupled to the metal block to dissipate heat generated by the semiconductor laser array, wherein the metal block facilitates heat dissipation via fast-flowing coolant fluids circulating through embedded cooling channels.

2. The focusing optics of claim 1, wherein the plurality of optical elements is configured to image the semiconductor laser array onto the target and a light path originating from the semiconductor laser array traverses at least two rows of optical elements among the plurality of optical elements and converges onto the target.

3. The focusing optics of claim 2, wherein the target is an imaging member in a printing system.

4. The focusing optics of claim 3, wherein an image of the semiconductor laser array is at least 70 mm wide.

5. The focusing optics of claim 2, wherein the semiconductor laser array produces at least a 300 dpi image onto an image plane.

6. The focusing optics of claim 2, wherein the focusing optics are configured to pass more than 50% of the light emitted from any laser of the array on the image of the laser.

7. The focusing optics of claim 2, wherein the focusing optics are configured to pass laser light in a wavelength range of 550 nm to 1000 nm.

8. The focusing optics of claim 1, wherein the plurality of optical elements is configured to receive light from a vertical cavity surface emitting laser array with at least 100 individually addressable lasers.

9. The focusing optics of claim 1, wherein the bonding agent is transparent to light in a wavelength range of 550 nm to 1000 nm.

10. The focusing optics of claim 9, wherein scattering elements are incorporated into the bonding agent to promote light diffusion.

11. The focusing optics of claim 1, wherein the optical elements among the plurality of optical elements are GRIN lenses.

12. Focusing optics, comprising:
    a plurality of optical elements disposed in at least two interdigitated rows and placed in a linear arrangement with half of addressing trace lines coming from a top side and the other half of the addressing trace lines coming from a bottom side, wherein each of the optical elements among the plurality of optical elements is configured to pass light from a semiconductor laser array comprising at least 100 individually addressable lasers through the optical elements among the plurality of optical elements and to image light of the semiconductor laser array on a target; and
    a metal block with high thermal conductivity, wherein the plurality of optical elements and the semiconductor laser array are thermally coupled to the metal block to dissipate heat generated by the semiconductor laser array, wherein the metal block facilitates heat dissipation via fast-flowing coolant fluids circulating through embedded cooling channels.

13. The focusing optics of claim 12, wherein an image of an individual laser among the at least 100 individually addressable lasers is inverted.

14. The focusing optics of claim 13, wherein the target is an imaging member of a printing system.

15. The focusing optics of claim 14, wherein an image of the semiconductor laser array is at least 70 mm wide.

16. The focusing optics of claim 14, wherein the semiconductor laser array produces at least a 300 dpi image onto the imaging member.

17. The focusing optics of claim 12 configured to image at least two semiconductor laser arrays through at least two optical elements among the plurality of optical elements disposed in at least two rows.

18. The focusing optics of claim 17, wherein at least two images are combined with at least one beam combiner.

* * * * *